United States Patent
Sim et al.

(10) Patent No.: US 10,859,921 B2
(45) Date of Patent: Dec. 8, 2020

(54) MASKLESS EXPOSURE DEVICE, MASKLESS EXPOSURE METHOD AND DISPLAY SUBSTRATE MANUFACTURED BY THE MASKLESS EXPOSURE DEVICE AND THE MASKLESS EXPOSURE METHOD

(71) Applicant: SAMSUNG DISPLAY CO., LTD., Yongin (KR)

(72) Inventors: Jun-Ho Sim, Suwon-si (KR); Sang-Hyun Yun, Suwon-si (KR); Hi-Kuk Lee, Yongin-si (KR); Hyun-Seok Kim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 225 days.

(21) Appl. No.: 14/738,543

(22) Filed: Jun. 12, 2015

(65) Prior Publication Data
US 2016/0091796 A1    Mar. 31, 2016

(30) Foreign Application Priority Data

Sep. 29, 2014   (KR) ........................ 10-2014-0130501

(51) Int. Cl.
*G03F 7/20*   (2006.01)
*G03F 9/00*   (2006.01)
*H01L 23/544*   (2006.01)

(52) U.S. Cl.
CPC ...... *G03F 7/70475* (2013.01); *G03F 7/70291* (2013.01); *G03F 7/70508* (2013.01);
(Continued)

(58) Field of Classification Search
CPC ............. G03F 7/70058; G03F 7/70291; G03F 7/70508; G03F 7/702; G03F 7/70283; G03F 7/70383; G03F 7/70391; G03F 7/70425; G03F 7/70433; G03F 7/70525; G03F 7/70491; G03F 9/7003; G03F 9/7046;
(Continued)

(56) References Cited

U.S. PATENT DOCUMENTS 4,806,987 A * 2/1989 Mori ................... G03F 7/70475
                                                        355/53
5,250,983 A * 10/1993 Yamamura .......... G03F 7/70425
                                                       355/125
(Continued)

FOREIGN PATENT DOCUMENTS

KR   1020090005884   1/2009
KR   1020110053768   5/2011
KR   1020120009924   2/2012

*Primary Examiner* — Christina A Riddle
(74) *Attorney, Agent, or Firm* — F. Chau & Associates, LLC

(57) ABSTRACT

A maskless exposure device includes an exposure head that includes a digital micro-mirror device configured to reflect a source beam received from an exposure source to a substrate to scan an exposure beam to the substrate, and a system control part configured to control the digital micro-mirror device using a graphic data system file. The graphic data system file includes data of an align-key. The align-key includes an X-align-key that extends in a direction parallel to a scan direction of the exposure head, and has a bar shape in a plan view, and a Y-align-key disposed adjacent to the X-align-key that has a frame shape in a plan view.

18 Claims, 18 Drawing Sheets

(52) U.S. Cl.
CPC ...... *G03F 7/70633* (2013.01); *G03F 7/70683* (2013.01); *G03F 9/7076* (2013.01); *H01L 23/544* (2013.01); *H01L 2223/544* (2013.01)

(58) Field of Classification Search
CPC ...... G03F 9/7073; G03F 9/7076; G03F 9/708; G03F 9/7084; G03F 7/70466; G03F 7/70475; G03F 7/70483–70541; G03F 7/70616; G03F 7/70625; G03F 7/70633; G03F 7/70666; G03F 7/70675; G03F 7/70683; H01L 21/0273

USPC .................. 355/46, 52, 53, 55, 67–75, 77; 250/492.1, 492.2, 492.22, 492.23, 493.1, 250/494.1, 503.1, 504 R, 548; 356/399–401

See application file for complete search history.

(56) References Cited

U.S. PATENT DOCUMENTS

| | | | | |
|---|---|---|---|---|
| 6,128,089 | A * | 10/2000 | Ausschnitt | G03F 7/70633 250/548 |
| 6,515,734 | B1 * | 2/2003 | Yamada | G03F 7/70216 250/492.2 |
| 2003/0021465 | A1 * | 1/2003 | Adel | G03F 7/70633 382/151 |
| 2005/0161426 | A1 * | 7/2005 | Ozaki | G03F 7/2057 216/13 |
| 2006/0092419 | A1 * | 5/2006 | Gui | G03F 7/70216 356/401 |
| 2007/0298330 | A1 * | 12/2007 | Chen | G03F 1/44 430/5 |
| 2009/0199152 | A1 | 8/2009 | Sjostrom | |
| 2011/0205508 | A1 * | 8/2011 | Yun | G03B 27/52 355/41 |
| 2013/0059240 | A1 * | 3/2013 | Van Der Schaar | G03F 7/70633 430/30 |

* cited by examiner

MASKLESS EXPOSURE DEVICE, MASKLESS EXPOSURE METHOD AND DISPLAY SUBSTRATE MANUFACTURED BY THE MASKLESS EXPOSURE DEVICE AND THE MASKLESS EXPOSURE METHOD

CROSS-REFERENCE TO RELATED APPLICATIONS

This application claims priority under 35 U.S.C. § 119 from Korean Patent Application No. 10-2014-0130501, filed on Sep. 29, 2014 in the Korean Intellectual Property Office, and all the benefits accruing therefrom, the contents of which are herein incorporated by reference in their entirety.

BACKGROUND

1. Technical Field

Exemplary embodiments of the present inventive concept are directed to a maskless exposure device, a maskless exposure method and a display substrate manufactured by the maskless exposure device and the maskless exposure method.

2. Discussion of the Related Art

In general, to form a metal pattern that includes a thin film transistor ("TFT"), which is a switching element of a display substrate, and signal lines, a metal layer and a photoresist layer are sequentially formed, and a mask corresponding to the metal pattern is disposed on the photoresist layer.

Then, light is irradiated upon an upper surface of the mask so that the photoresist layer is exposed and developed. Thus, a photoresist pattern corresponding to the mask is formed. The metal layer is etched to form the metal pattern, using the photoresist pattern as an etch stop layer.

A display substrate typically has a plurality of metal patterns with different shapes, so that a plurality of masks corresponding to the number of the metal patterns is required to fabricate the display substrate. In addition, when the shape of a metal pattern is changed, the shape of the corresponding mask should be changed so that a new mask needs to be fabricated. The cost of fabricating the mask is relatively high so that a manufacturing cost of the display substrate may increase.

To address the above mentioned situation, a maskless exposure device that can irradiate a plurality of beams to a substrate without a mask may be used. In a maskless exposure device, the beams may be independently turned on or off so that the beams are selectively irradiated to the substrate. Thus, a desired photoresist pattern may be formed on the substrate.

However, each beam has a different optical character, such as a size, position and intensity. Thus, a wiring may be formed that has a non-uniform shape. Accordingly, defects, such as display panel stains, may occur.

SUMMARY

Exemplary embodiments of the present inventive concept may provide a maskless exposure device capable of decreasing defects on display panel.

Exemplary embodiments of the present inventive concept may further provide a maskless exposure method capable of decreasing defects on display panel.

Exemplary embodiments of the present inventive concept may further provide a display substrate manufactured by the maskless exposure device and the maskless exposure method.

In an exemplary embodiment of a maskless exposure device according to the present inventive concept, the maskless exposure device includes an exposure head that comprises a digital micro-mirror device, the digital micro-mirror device being configured to reflect a source beam received from an exposure source to a substrate to scan an exposure beam to the substrate, a system control part configured to control the digital micro-mirror device using a graphic data system file. The graphic data system file includes data of an align-key. The align-key includes an X-align-key that extends in a direction parallel with a scan direction of the exposure head, and has a bar shape in a plan view and a Y-align-key disposed adjacent to the X-align-key that has a frame shape in a plan view.

In an exemplary embodiment, the X-align-key may include a first plurality of sub-X-align-keys disposed in a first exposure area, a second plurality of sub-X-align-keys disposed in a second exposure area adjacent to the first exposure area, where the second plurality of sub-X-align-keys are disposed symmetrically with the first plurality of sub-X-align-keys relative to a boundary between the first exposure area and the second exposure area and a boundary sub-X-align-key disposed on the boundary between the first exposure area and the second exposure area that has a shape that is symmetric relative to the boundary between the first exposure area and the second exposure area.

In an exemplary embodiment, each of the sub-X-align-keys may have a same width.

In an exemplary embodiment, each of the first plurality of sub-X-align-keys and the second plurality of sub-X-align-keys may include three sub-X-align-keys.

In an exemplary embodiment, each of the first plurality of sub-X-align-keys and the second plurality of sub-X-align-keys may includes four sub-X-align-keys.

In an exemplary embodiment, the Y-align-key may include a first sub-Y-align-key disposed in a first exposure area, a second sub-Y-align-key disposed in a second exposure area adjacent to the first exposure area, wherein the second sub-Y-align-key is disposed symmetric with the first sub-Y-align-key relative to the boundary between the first exposure area and the second exposure area and a third sub-Y-align-key disposed on the boundary between the first exposure area and the second exposure area that has a shape that is symmetric relative to the boundary between the first exposure area and the second exposure area.

In an exemplary embodiment, the system control part may include a file producing part configured to produce a graphic data system file for each of a plurality of patterns to be formed on the substrate, a data outputting part configured to generate digital micro-mirror device on/off data from the graphic data system file to control on/off timing of the digital micro-mirror device and a transfer control part configured to output a transfer signal that transfers a stage upon which the substrate is fixed.

In an exemplary embodiment, the transfer control part may control on/off timing of the exposure beam and may transfer the stage in response to the digital micro-mirror device on/off data received from the data outputting part.

In an exemplary embodiment of a method of maskless exposure according to the present inventive concept, the method includes producing a graphic data system file with respect to a pattern formed on a substrate, generating digital micro-mirror device on/off data from the graphic data system file, exposing the substrate in response to the digital micro-mirror device on/off data, generating a first correction data to correct a misalignment of an X-component, and generating a second correction data to correct a misalignment of a Y-component. The graphic data system file includes data of an align-key. The align-key includes a an X-align-key that extends in a direction parallel to a scan direction of the exposure head, and that has a bar shape in a plan view, and a Y-align-key disposed adjacent to the X-align-key that has a frame shape in a plan view.

In an exemplary embodiment, the X-align-key may include a plurality of sub-X-align-keys organized into a first plurality of sub-X-align-keys disposed in a first exposure area, a second plurality of sub-X-align-keys disposed in a second exposure area adjacent to the first exposure area, where the second plurality of sub-X-align-keys are disposed symmetrically to the first plurality of sub-X-align-keys relative to a boundary between the first exposure area and the second exposure area, and a boundary sub-X-align-key disposed on the boundary between the first exposure area and the second exposure area that has a shape that is symmetric relative to the boundary between the first exposure area and the second exposure area. Each of the plurality of sub-X-align-keys may have the same width.

In an exemplary embodiment, generating the first correction data may include measuring widths of each of a plurality of X-align-key patterns formed using the plurality of sub-X-align-keys, calculating an average width of the first plurality of X-align-key patterns and an average width of the second plurality of X-align-key patterns, calculating a target width of an X-align-key pattern on the boundary between the first exposure area and the second exposure area from one half of a sum of the average width of the first plurality of X-align-key patterns and the average width of the second plurality of X-align-key patterns, comparing the target width of the X-align-key pattern with the width of the boundary X-align-key pattern, and generating the first correction data that corrects a misalignment of X-component using difference between the target width X-align-key pattern and the width of the boundary X-align-key pattern.

In an exemplary embodiment, each of the first plurality of sub-X-align-keys and second plurality of sub-X-align-keys may have three sub-X-align-keys.

In an exemplary embodiment, each of the first plurality of sub-X-align-keys and second plurality of sub-X-align-keys may have four sub-X-align-keys.

In an exemplary embodiment, the Y-align-key includes comprises a plurality of sub-Y-align-keys that may include a first sub-Y-align-key disposed in a first exposure area, a second sub-Y-align-key disposed in a second exposure area adjacent to the first exposure area, where the second sub-Y-align-key is disposed symmetrically with the first sub-Y-align-key relative to the boundary between the first exposure area and the second exposure area, and a third sub-Y-align-key disposed on the boundary between the first exposure area and the second exposure area that has a shape that is symmetric relative to the boundary between the first exposure area and the second exposure area.

In an exemplary embodiment, generating the second correction data may include measuring total-pitches of a plurality of Y-align-key patterns formed using the plurality of sub-Y-align-keys, measuring misalignment values of each of the plurality of Y-align-key patterns, and generating the second correction data that corrects a misalignment of Y-component using misalignment values of each of the plurality of Y-align-key patterns.

In an exemplary embodiment, when there is a misalignment of one or both of the X-component and the Y-component, the method may further comprise exposing the substrate according to one or both of the first and the second correction data.

In an exemplary embodiment of a display substrate according to the present inventive concept, the display substrate includes a gate line extending in a first direction, a data line extending in a second direction crossing the first direction, a switching element comprising a gate electrode electrically connected with the gate line, a source electrode electrically connected with the data line, a drain electrode spaced apart from the source electrode and an active pattern disposed between the source electrode and the drain electrode, a pixel electrode electrically connected with the switching element, a X-align-key pattern that overlaps the data line in a plan view, extends in the second direction, and has a bar shape in a plan view and a Y-align-key pattern disposed adjacent to the X-align-key that has a frame shape in a plan view.

In an exemplary embodiment, the X-align-key pattern may include a first to a seventh sub-X-align-key patterns. The Y-align-key pattern may include a first to a third sub-Y-align-key patterns.

In an exemplary embodiment, the X-align-key pattern may include a first to a ninth sub-X-align-key patterns. The Y-align-key pattern may include a first to a third sub-Y-align-key patterns.

In an exemplary embodiment, the gate line, the X-align-key pattern and the Y-align-key pattern may be disposed on the same layer.

According to a present exemplary embodiment, a graphic data system file includes data of an X-align-key and a Y-align-key that can correct a misalignment of that X-component and Y-component. Thus, an alignment of the X-component and Y-component may be improved.

In addition, there is an X-align-key and a Y-align-key disposed on a boundary between adjacent scans. Thus, an alignment between adjacent scans may be improved.

DETAILED DESCRIPTION OF EXEMPLARY EMBODIMENTS

Hereinafter, exemplary embodiments of the inventive concept will be explained in detail with reference to the accompanying drawings.

Figure 1:
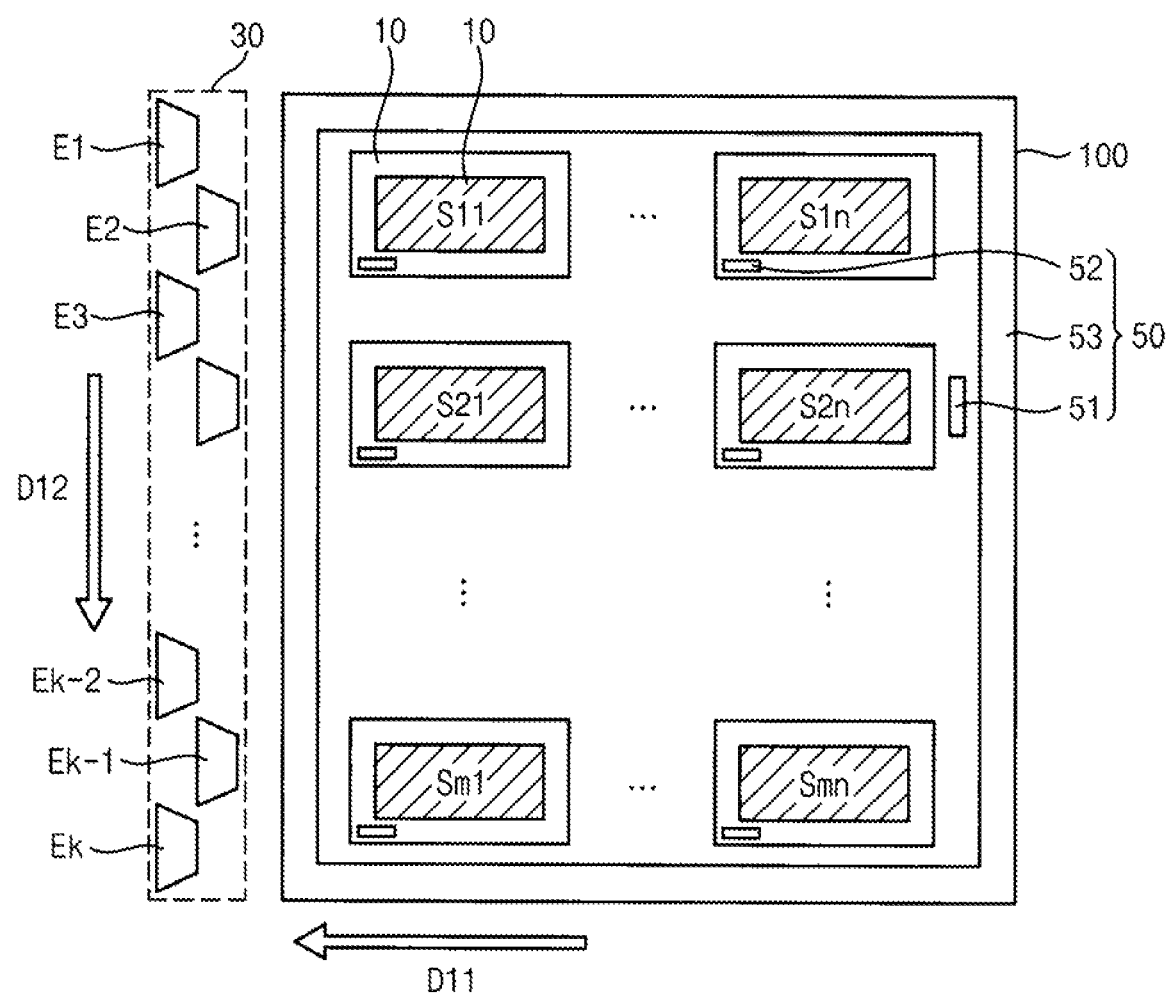
FIG. 1 is a plan view that illustrates a maskless exposure device according to an exemplary embodiment of the present inventive concept.

FIG. 1 is a plan view that illustrates a maskless exposure device according to an exemplary embodiment of the present inventive concept.

Referring to FIG. 1, a substrate 100 is a main substrate for forming a display panel. The substrate 100 includes a plurality of first areas 10 and a plurality of second areas 50 that exclude the first areas 10. A plurality of display panels S11, . . . , Smn are arranged in a matrix shape with one display panel formed in each first area 10. In this case, 'm' and 'n' are natural numbers. The second areas 50 includes glass ID areas 51 where an identification number of the substrate 100 is formed, and cell ID areas 52 where identification numbers of the display panels are formed. In addition, the second areas 50 include an edge exposure area 53 that is an edge portion of the substrate 100.

The substrate 100 is transferred below an exposure part 30 along a first direction D11 to be exposed. The substrate 100 is transferred to the exposure part 30 by a stage (not shown) disposed below the substrate 100.

To expose the substrate 100, a step exposing method or a scan exposing method may be employed. In a step exposing method, the substrate is transferred and stopped repeatedly during exposing. In a scan exposing method, the substrate is continuously transferred during the exposure. For example, an island pattern may be formed by a step exposing method, and a strip pattern may be formed by a scan exposing method.

The exposure part 30 includes a plurality of exposure heads E1, E2, E3, . . . , Ek−2, Ek−1 and Ek. The exposure heads E1, E2, E3, . . . , Ek−2, Ek−1 and Ek are arranged in a second direction D12 substantially perpendicular to the first direction D11. In this case, 'k' is a natural number.

For example, the exposure heads E1, E2, E3, . . . , Ek−2, Ek−1 and Ek may be disposed in two rows. The exposure heads of a first row and the exposure heads of a second row may alternate in the second direction D12. Although not shown in FIG. 1, the exposure heads E1, E2, E3, . . . , Ek−2, Ek−1 and Ek may have various other arrangements in the second direction D12.

The exposure part 30 exposes the substrate 100 so that an exposure pattern is formed in a reverse direction of the transfer direction D11.

Each exposure head E1, E2, E3, . . . , Ek−2, Ek−1 and Ek includes a digital micro-mirror device ("DMD"). A DMD may irradiate an exposure beam in response to an on/off data signal. A source beam from a digital mirror of a cell of a DMD is reflected to generate the exposure beam, and an exposure beam may exit from each of the exposure heads E1, E2, E3, . . . , Ek−2, Ek−1 and Ek.

Figure 2:
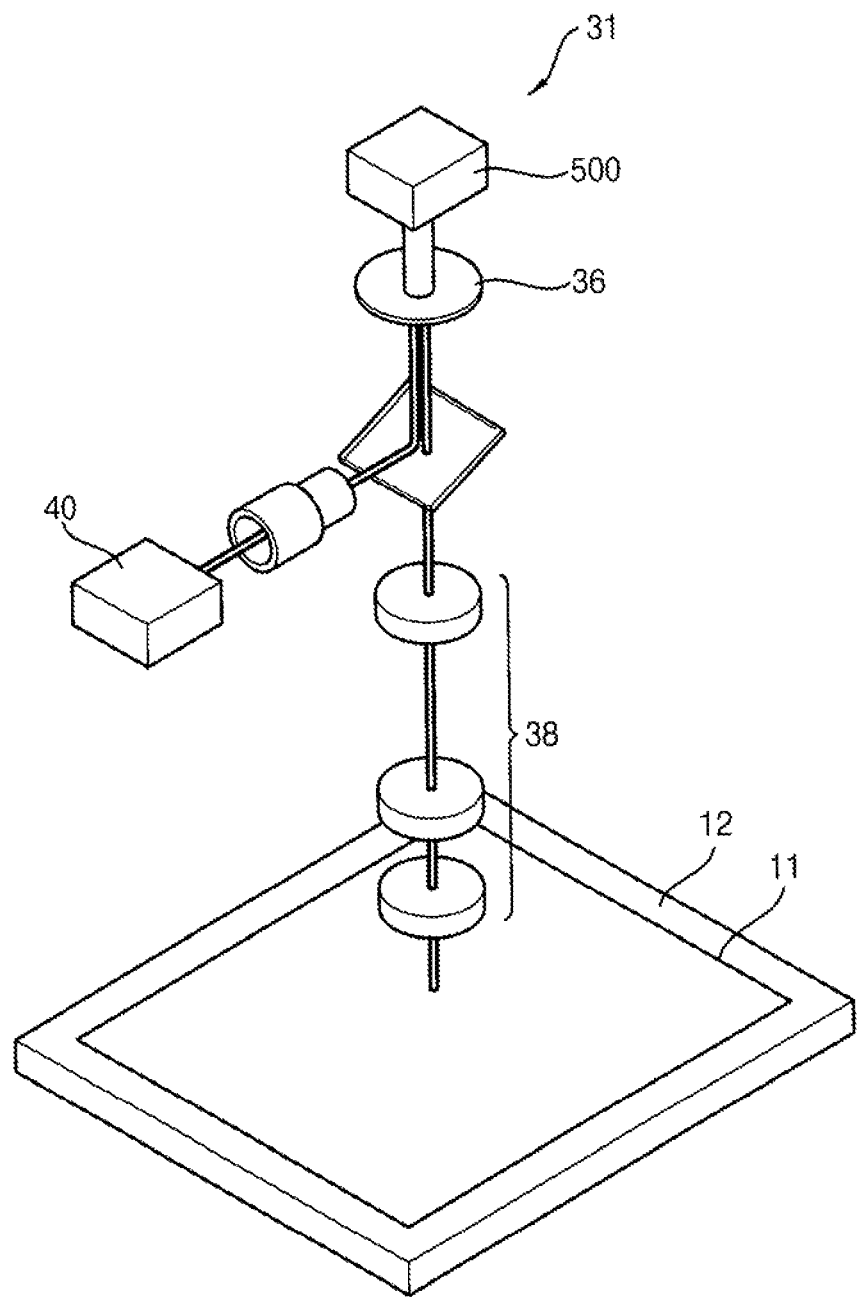
FIG. 2 is a perspective view that illustrates an exposure head according to an exemplary embodiment of the exposure device of FIG. 1.

FIG. 2 is a perspective view that illustrates an exposure head according to an exemplary embodiment of the exposure device of FIG. 1.

Referring to FIGS. 1 and 2, an exposure head 31, such as one of the exposure heads E1, E2, E3, . . . , Ek−2, Ek−1 and Ek shown in FIG. 1, includes a DMD 36. The DMD 36 receives the source beam from an exposure source 40. The source beam may be an ultraviolet (UV) beam for exposing a photoresist film 11. The photoresist film 11 is formed on a target substrate 12 corresponding to an object to be exposed. When a pattern needs to be formed on a substrate, the photoresist film 11 is used to form a mask of the pattern. The photoresist film 11 may be formed by coating a photosensitive resin such as an epoxy resin on a surface of a glass target substrate 12. The DMD 36 selectively reflects the source beam for each pixel based on image data transferred to the target substrate 12.

The exposure head 31 includes a projection optical device 38. The projection optical device 38 includes a plurality of lenses that focus light selectively reflected from the DMD 36 into the exposure beam.

Figure 3:
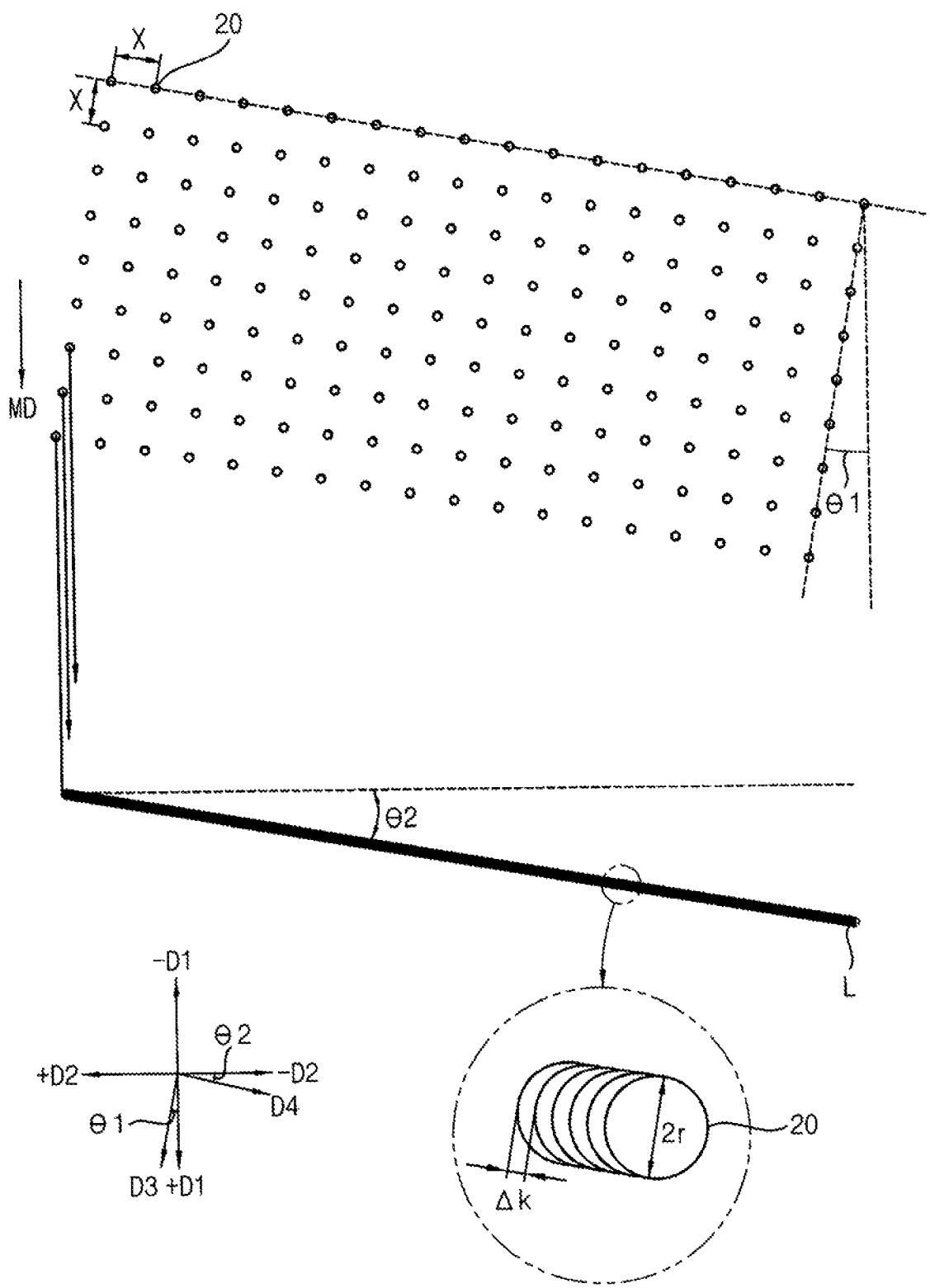
FIG. 3 is a plan view that illustrates an exposure step using an exposure head in FIG. 1.

FIG. 3 is a plan view that illustrates an exposure step using an exposure head in FIG. 1.

Referring to FIG. 3, a maskless exposure device according to an exemplary embodiment of the present inventive concept is inclined by a first angle $\theta_1$ with respect to a side of a substrate extending in a first direction +D1 and −D1. Let a second direction +D2 and −D2 define a direction substantially perpendicular to the first direction +D1 and −D1, then an inclined direction of the maskless exposure device is between the first direction +D1 and −D1 and the second direction +D2 and −D2. Hereinafter, the first direction +D1 and −D1 is divided into a positive first direction +D1 and a negative first direction −D1, and the second direction +D2 and −D2 is divided into a positive second direction +D2 and a negative second direction −D2.

The inclined direction of the maskless exposure device may be a third direction D3 between the positive first direction +D1 and the positive second direction +D2. The third direction D3 is rotated clockwise by the first angle $\theta_1$, an acute angle, with respect to a reference line extending in the first direction +D1 and −D1. For example, the first angle $\theta_1$ may be between about 0.1° and about 0.5°.

The maskless exposure device provides the spot beams 20 onto the substrate along a scanning direction MD. The scanning direction MD is substantially the same as the first positive direction +D1. When the first angle $\theta_1$ of the maskless exposure device is about 0° and the maskless exposure device exposes the substrate along the positive first direction +D1, a region between adjacent spot beams 20 on the substrate is not exposed. Therefore, to expose an entire predetermined region, the maskless exposure device irradiates light onto the substrate.

When micro-mirrors receive the activated data and the spot beams 20 are irradiated onto a stopped substrate, the spot beams 20 are spaced apart from each other in the third direction D3 by a predetermined distance "x." In addition, the spot beams 20 are spaced apart from each other in a direction substantially perpendicular to the third direction D3 by the determined distance "x."

To selectively expose a predetermined region of the substrate, for example, a pattern-forming region L, the spot beams 20 are selectively irradiated in the pattern-forming region L. In a present exemplary embodiment, the pattern-forming region L is defined as a region extending along a fourth direction D4 inclined in a clockwise direction with respect to a side of the substrate by a second angle $\theta_2$. The pattern-forming region L may have a rectangular shape that extends in the fourth direction D4. When the maskless exposure device exposes the entire pattern-forming region L, circular shaped spot beams 240 having a diameter "2r" overlap with each other by a predetermined distance "Δk" in the pattern-forming region L so that the entire substrate of the pattern-forming region L is exposed.

Figure 4:
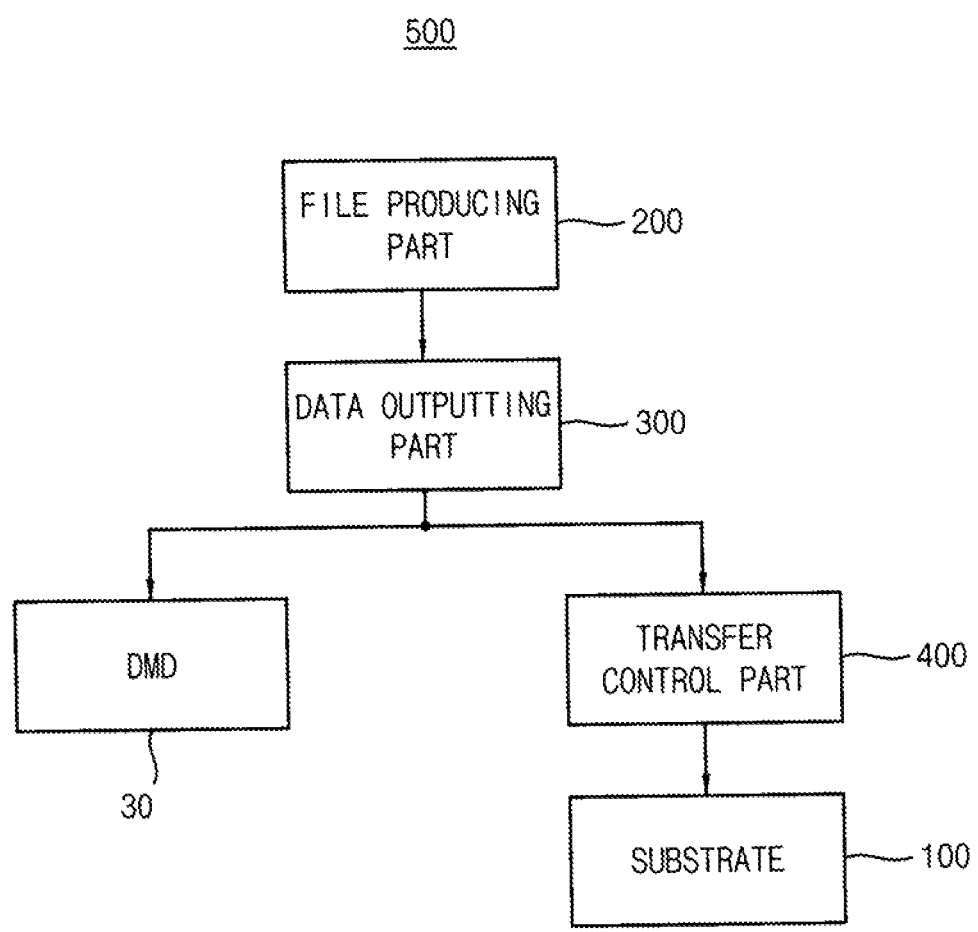
FIG. 4 is a block diagram of a system control part according to an exemplary embodiment of the maskless exposure device of FIG. 1.

FIG. 4 is a block diagram of a system control part according to an exemplary embodiment of the maskless exposure device of FIG. 1.

Referring to FIGS. 1 and 4, a system control part 500 may include a file producing part 200, a data outputting part 300 and a transfer control part 400.

The file producing part 200 produces a graphic data system ("GDS") file. The GDS file is an inverse of a multilayered computer-aided design (CAD) file. For example, the GDS file includes data for each layer, such as a gate pattern, an active pattern, source drain patterns, etc.

The data outputting part 300 generates the digital micro-mirror device on/off data from the graphic data system GDS file.

The data outputting part 300 outputs the digital micro-mirror device on/off data to the digital micro-mirror device 36 and to the transfer control part 400.

The transfer control part 400 outputs a transfer signal which transfers the stage (not shown). The transfer control part 400 controls on/off timing of the exposure beam in response to the DMD on/off data supplied from the data outputting part 300, and transfers the stage.

A maskless exposure device according to an exemplary embodiment of the present inventive concept may manufacture a display substrate by using a manufacturing method that includes producing a graphic data system file respectively corresponding to each of a plurality of patterns to be formed on a substrate, generating digital micro-mirror device on/off data from the graphic data system files to control on/off timing of the digital micro-mirror device and exposing the substrate according to the digital micro-mirror device on/off data.

The DMD on/off data is generated from the GDS file in the data outputting part 300. An on/off file for generating the DMD on/off data may be configured by '1's and '0's in a binary file. In this embodiment, when the on/off data is '1', the DMD is turned on so that light is irradiated to a substrate. Alternatively, when the on/off data is '0', the DMD is turned off so that no light is irradiated to the substrate.

The DMD can selectively reflect light based on the DMD on/off data to expose the substrate 100 according to the data of the patterns stored in the GDS file. Therefore, a substrate having the patterns may be formed.

Figure 5:
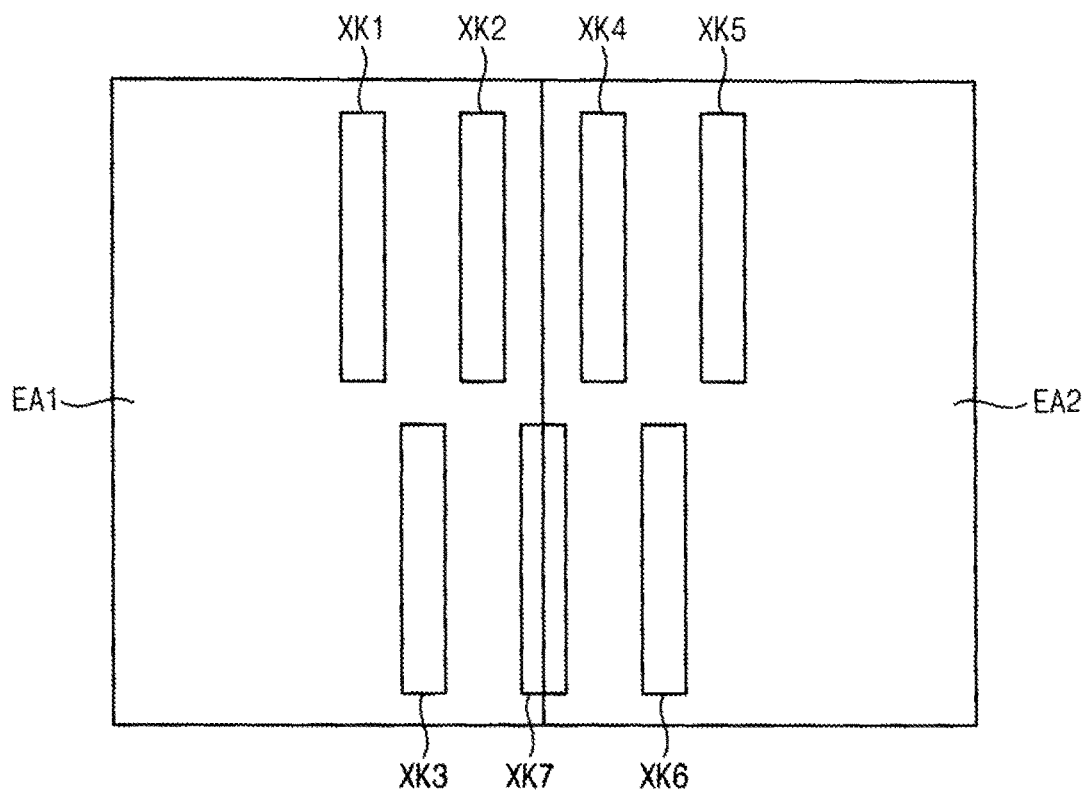
FIG. 5 is a plan view that illustrates an X-align-key of a graphic data system file used for a digital micro-mirror device of an exposure head according to an exemplary embodiment of the present inventive concept.

FIG. 5 is a plan view that illustrates an X-align-key of a graphic data system file used for a digital micro-mirror device of an exposure head according to an exemplary embodiment of the present inventive concept.

Referring to FIG. 5, an X-align-key according to an exemplary embodiment of the present inventive concept includes a first sub-X-align-key XK1, a second sub-X-align-key XK2 and a third sub-X-align-key XK3 disposed in a first exposure area EA1, a fourth sub-X-align-key XK4, a fifth sub-X-align-key XK5 and a sixth sub-X-align-key XK6 disposed in a second exposure area EA2 adjacent to the first exposure area EA1, and a seventh sub-X-align-key XK7 disposed on a boundary between the first exposure area EA1 and the second exposure area EA2. The fourth sub-X-align-key XK4, the fifth sub-X-align-key XK5 and the sixth sub-X-align-key XK6 are disposed symmetrically with the first sub-X-align-key XK1, the second sub-X-align-key XK2 and the third sub-X-align-key XK3 relative to the boundary between the first exposure area EA1 and the second exposure area EA2. The seventh sub-X-align-key XK7 has a shape that is symmetric relative to the boundary between the first exposure area EA1 and the second exposure area EA2.

The first to the seventh sub-X-align-keys XK1, XK2, XK3, XK4, XK5, XK6 and XK7 may have the same width. The first to the seventh sub-X-align-keys XK1, XK2, XK3, XK4, XK5, XK6 and XK7 may have a bar shape in a plan view.

The first sub-X-align-key XK1, the second sub-X-align-key XK2, the fourth sub-X-align-key XK4 and the fifth sub-X-align-key XK5 may be disposed in a first column. The third sub-X-align-key XK3, the sixth sub-X-align-key XK6 and the seventh sub-X-align-key XK7 may be disposed in a second column. The sub-X-align keys in each column extend in a direction parallel to the scan direction of the exposure head 31.

Since the seventh sub-X-align-key XK7 has a shape that is symmetric relative to the boundary between the first exposure area EA1 and the second exposure area EA2, a portion of the seventh sub-X-align-key XK7 disposed in the first exposure area EA1 and a portion of the seventh sub-X-align-key XK7 disposed in the second exposure area EA2 may have the same area.

When exposure heads that expose the first exposure area EA1 and the second exposure area EA2 are aligned, a width of a pattern formed by the seventh sub-X-align-key XK7 may be the same as the widths of patterns formed by the first to the sixth sub-X-align-keys XK1, XK2, XK3, XK4, XK5 and XK6. However, when exposure heads that expose the first exposure area EA1 and the second exposure area EA2 are misaligned, a width of the pattern formed by the seventh sub-X-align-key XK7 may differ from the widths of patterns formed by the first to the sixth sub-X-align-keys XK1, XK2, XK3, XK4, XK5 and XK6.

Therefore, a misalignment of an X-component may be found by comparing the width of pattern formed by the seventh sub-X-align-key XK7 with the widths of patterns formed by the first to the sixth sub-X-align-keys XK1, XK2, XK3, XK4, XK5 and XK6.

Figure 6:
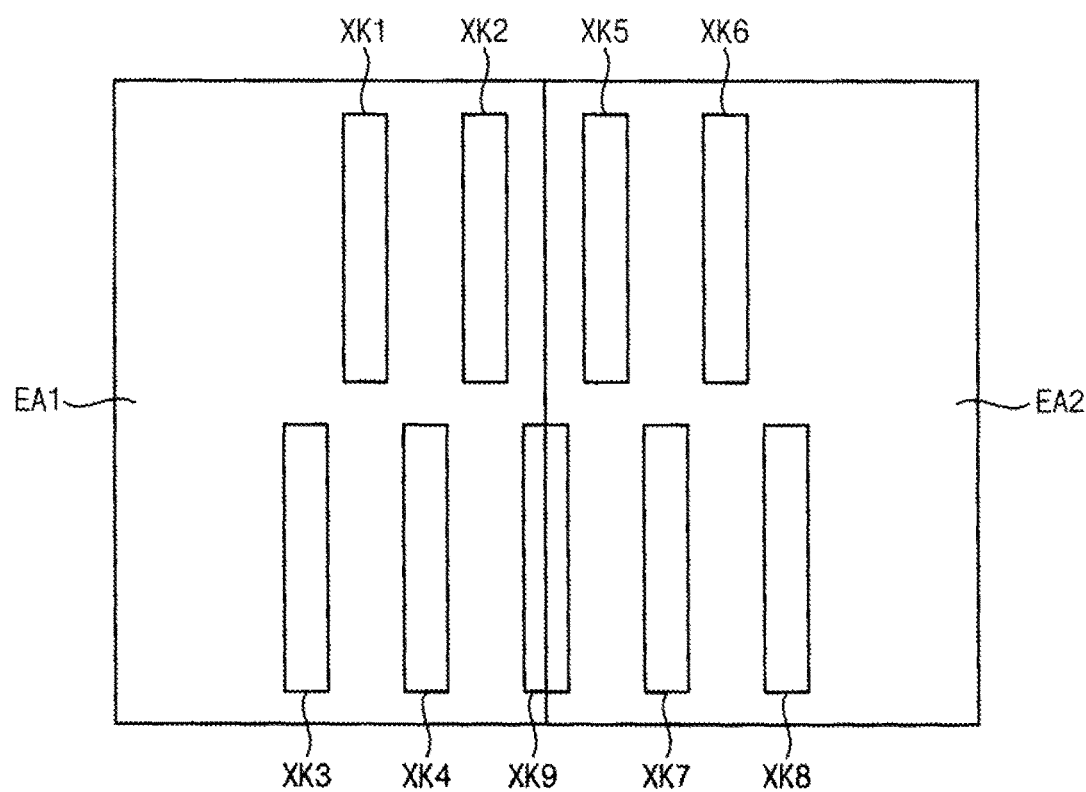
FIG. 6 is a plan view that illustrates an X-align-key of a graphic data system file used for a digital micro-mirror device of an exposure head according to an exemplary embodiment of the present inventive concept.

FIG. 6 is a plan view that illustrates an X-align-key of a graphic data system file used for a digital micro-mirror device of an exposure head according to an exemplary embodiment of the present inventive concept.

Referring to FIG. 6, an X-align-key according to an exemplary embodiment of the present inventive concept includes a first sub-X-align-key XK1, a second sub-X-align-key XK2, a third sub-X-align-key XK3 and a fourth sub-X-align-key XK4 disposed in a first exposure area EA1, a fifth sub-X-align-key XK5, a sixth sub-X-align-key XK6, a seventh sub-X-align-key XK7 and a eighth sub-X-align-key XK8 disposed in a second exposure area EA2 adjacent to the first exposure area EA1, and a ninth sub-X-align-key XK9 disposed on a boundary between the first exposure area EA1 and the second exposure area EA2. The fifth sub-X-align-key XK5, the sixth sub-X-align-key XK6, the seventh sub-X-align-key XK7 and the eighth sub-X-align-key XK8 are disposed symmetrically with the first sub-X-align-key XK1, the second sub-X-align-key XK2, the third sub-X-align-key XK3 and the fourth sub-X-align-key XK4 relative to the boundary between the first exposure area EA1 and the second exposure area EA2. The ninth sub-X-align-key XK9 has a shape that is symmetric relative to the boundary between the first exposure area EA1 and the second exposure area EA2.

The first to the ninth sub-X-align-keys XK1, XK2, XK3, XK4, XK5, XK6, XK7, XK8 and XK9 may have the same width. The first to the ninth sub-X-align-keys XK1, XK2, XK3, XK4, XK5, XK6, XK7, XK8 and XK9 may have a bar shape in a plan view.

The first sub-X-align-key XK1, the second sub-X-align-key XK2, the fifth sub-X-align-key XK5 and the sixth sub-X-align-key XK6 may be disposed in a first column. The third sub-X-align-key XK3, the fourth sub-X-align-key XK4, the seventh sub-X-align-key XK7, the eighth sub-X-align-key XK8 and the ninth sub-X-align-key X may be disposed in a second column. The sub-X-align keys in each column extend in a direction parallel to the scan direction of the exposure head 31.

When aligned exposure heads expose the first exposure area EA1 and the second exposure area EA2, a width of the pattern formed by the ninth sub-X-align-key XK9 may be the same as the widths of patterns formed by the first to the eighth sub-X-align-keys XK1, XK2, XK3, XK4, XK5, XK6, XK7 and XK8. However, when misaligned exposure heads expose the first exposure area EA1 and the second exposure area EA2, a width of the pattern formed by the ninth sub-X-align-key XK9 may differ from the widths of patterns formed by the first to the eighth sub-X-align-keys XK1, XK2, XK3, XK4, XK5, XK6, XK7 and XK8.

Therefore, a misalignment of an X-component may be found by comparing the width of the pattern formed by the ninth sub-X-align-key XK9 with the widths of patterns formed by the first to the eighth sub-X-align-keys XK1, XK2, XK3, XK4, XK5, XK6, XK7 and XK8.

Figure 7:
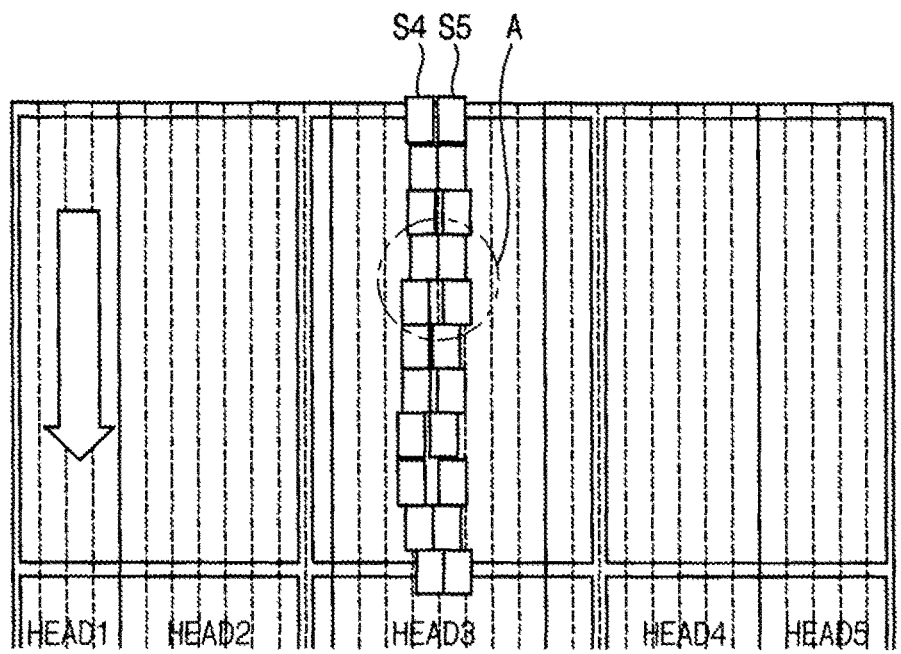
FIG. 7 is a plan view that illustrates a misalignment an X-component between scans of an exposure head according to an exemplary embodiment of the present inventive concept.
Figure 8:
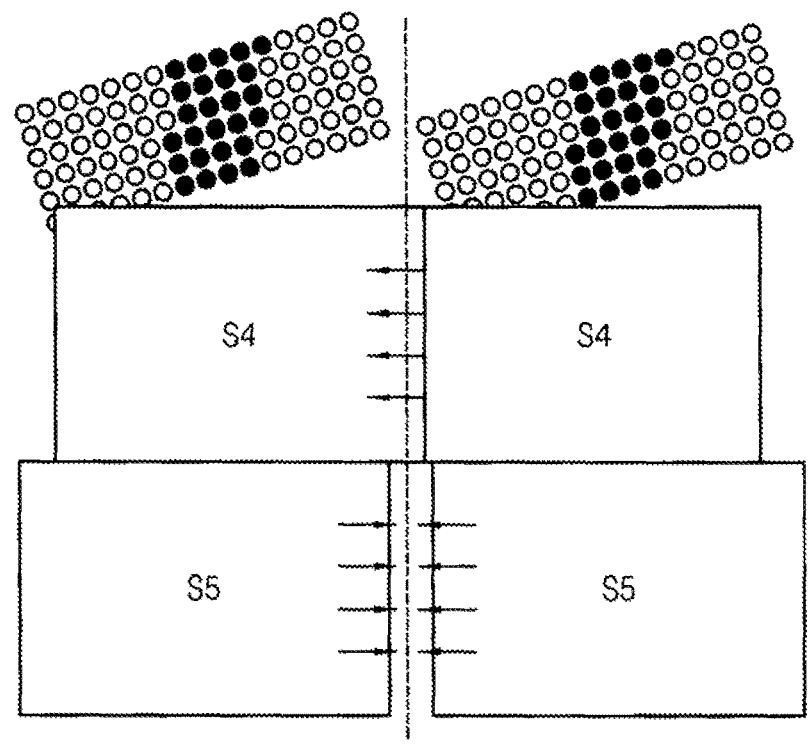
FIG. 8 is a plan view that magnifies portion "A" of FIG. 7.

FIG. 7 is a plan view that illustrates a misalignment of an X-component between scans of an exposure head according to an exemplary embodiment of the present inventive concept. FIG. 8 is a plan view that magnifies portion "A" of FIG. 7.

Referring to FIGS. 7 and 8, a misalignment of an X-component in a fourth scan S4 of an exposure head and a misalignment of an X-component in a fifth scan S5 of an exposure head are illustrated.

One exposure head may expose eight scans. For example, a width of one scan may be 66.5 mm. Thus, a width of an area exposed by one exposure head may be 532 mm.

The misalignment of the X-component between scans of an exposure head may cause a space between scans to become narrower and or a space between scans to become wider.

The misalignment of the X-component between scans of an exposure head may differ based on an area. For example, a space between the fourth scan S4 of an exposure head and the fifth scan S5 of an exposure head may become narrower in a fourth column, and a space between the fourth scan S4 of an exposure head and the fifth scan S5 of an exposure head may become wider in a fifth column.

Figure 9:
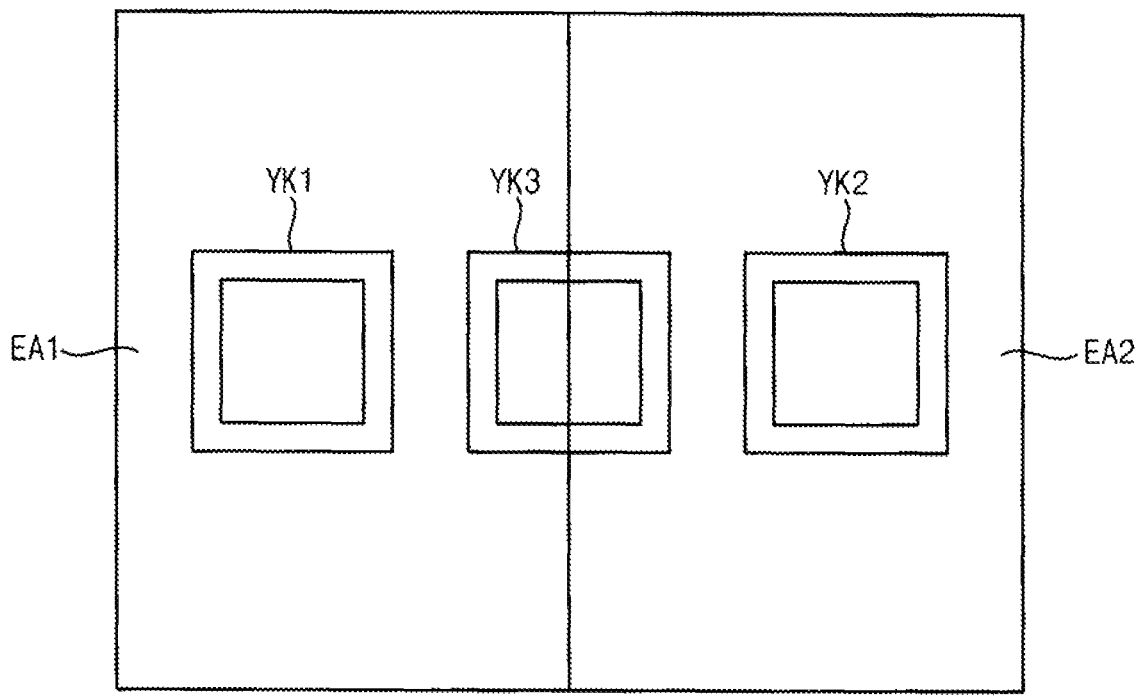
FIG. 9 is a plan view that illustrates a Y-align-key of a graphic data system file used for a digital micro-mirror device of an exposure head according to an exemplary embodiment of the present inventive concept.

FIG. 9 is a plan view that illustrates a Y-align-key of a graphic data system file used for a digital micro-mirror device of an exposure head according to an exemplary embodiment of the present inventive concept.

Referring to FIG. 9, a Y-align-key according to an exemplary embodiment of the present inventive concept includes a first sub-Y-align-key YK1 disposed in a first exposure area EA1, a second sub-Y-align-key YK2 disposed in a second exposure area EA2 adjacent to the first exposure area EA1 and a third sub-Y-align-key YK3 disposed on a boundary between the first exposure area EA1 and the second exposure area EA2. The second sub-Y-align-key YK2 is disposed symmetrically with the first sub-Y-align-key YK1 relative to the boundary between the first exposure area EA1 and the second exposure area EA2. The third sub-Y-align-key YK3 has a shape that is symmetric relative to the boundary between the first exposure area EA1 and the second exposure area EA2.

The first sub-Y-align-key YK1, the second sub-Y-align-key YK2 and the third sub-Y-align-key YK3 may have the same shape. The first sub-Y-align-key YK1, the second sub-Y-align-key YK2 and the third sub-Y-align-key YK3 may have a frame shape in a plan view.

Since the third sub-Y-align-key YK3 has a shape that is symmetric relative to the boundary between the first exposure area EA1 and the second exposure area EA2, a portion of the third sub-Y-align-key YK3 disposed in the first exposure area EA1 and a portion of the third sub-Y-align-key YK3 disposed in the second exposure area EA2 may have the same area.

When aligned exposure heads expose the first exposure area EA1 and the second exposure area EA2, a shape of a pattern formed by the third sub-Y-align-key YK3 may be the same as that shapes of patterns formed by the first sub-Y-align-key YK1 and the second sub-Y-align-key YK2. However, when misaligned exposure heads expose the first exposure area EA1 and the second exposure area EA2, the shape of the pattern formed by the third sub-Y-align-key YK3 may differ from the shapes of patterns formed by the first sub-Y-align-key YK1 and the second sub-Y-align-key YK2.

Therefore, a misalignment of a Y-component may be found by comparing the shape of a pattern formed by the third sub-Y-align-key YK3 with the shapes of patterns formed by the first sub-Y-align-key YK1 and the second sub-Y-align-key YK2.

Figure 10:
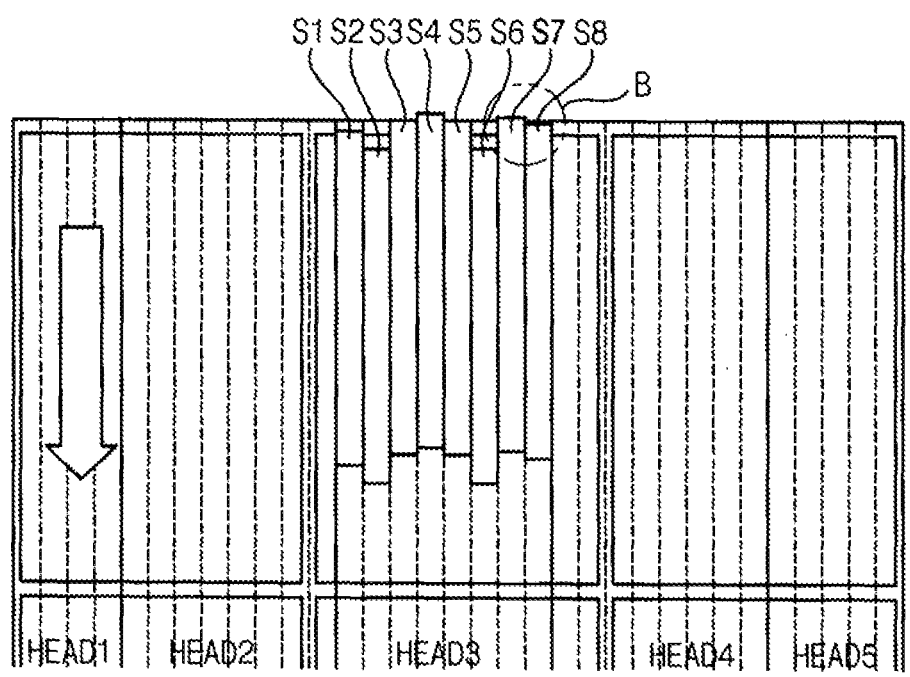
FIG. 10 is a plan view that illustrates a misalignment of a Y-component between scans of an exposure head according to an exemplary embodiment of the present inventive concept.
Figure 11:
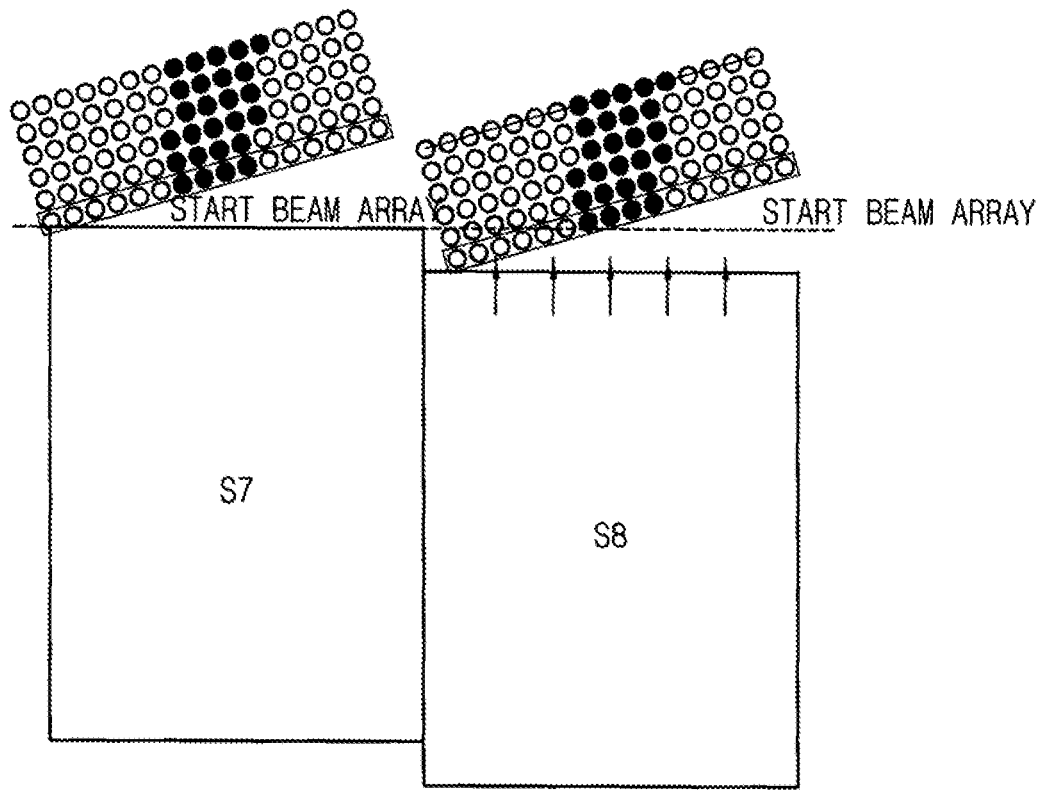
FIG. 11 is a plan view that magnifies portion "B" of FIG. 10.

FIG. 10 is a plan view that illustrating a misalignment of a Y-component between scans of an exposure head according to an exemplary embodiment of the present inventive concept. FIG. 11 is a plan view that magnifies portion "B" of FIG. 10.

Referring to FIGS. 10 and 11, a misalignment of Y-component in a first scan S1 of an exposure head to a misalignment of Y-component in an eighth scan S8 of an exposure head are illustrated.

One exposure head may expose eight scans. For example, a width of one scan may be 66.5 mm. Thus, a width of an area exposed by one exposure head may be 532 mm.

The misalignment of the Y-component between scans of an exposure head may cause a start point of an exposure to be higher than a reference point, as shown with the second scan S2 of FIG. 10, or may cause a start point of an exposure to be lower than a reference point, as shown with the fourth scan S4 of FIG. 10.

A start point of an exposure may different for every scan. For example, when a start point of a seventh scan S7 is a reference point, a start point of an eighth scan S8 may be lower than the start point of the seventh scan S7. A misalignment of the Y-component may occur for every scan. Therefore, a misalignment of the second scan S2 may be corrected on the basis of a start point of the first scan S1. Thereafter, a misalignment of a third scan S3 may be corrected on the basis of the corrected start point of the second scan S2. That is, a misalignment of a scan may be corrected on the basis of a start point of a previous scan.

Figure 12:
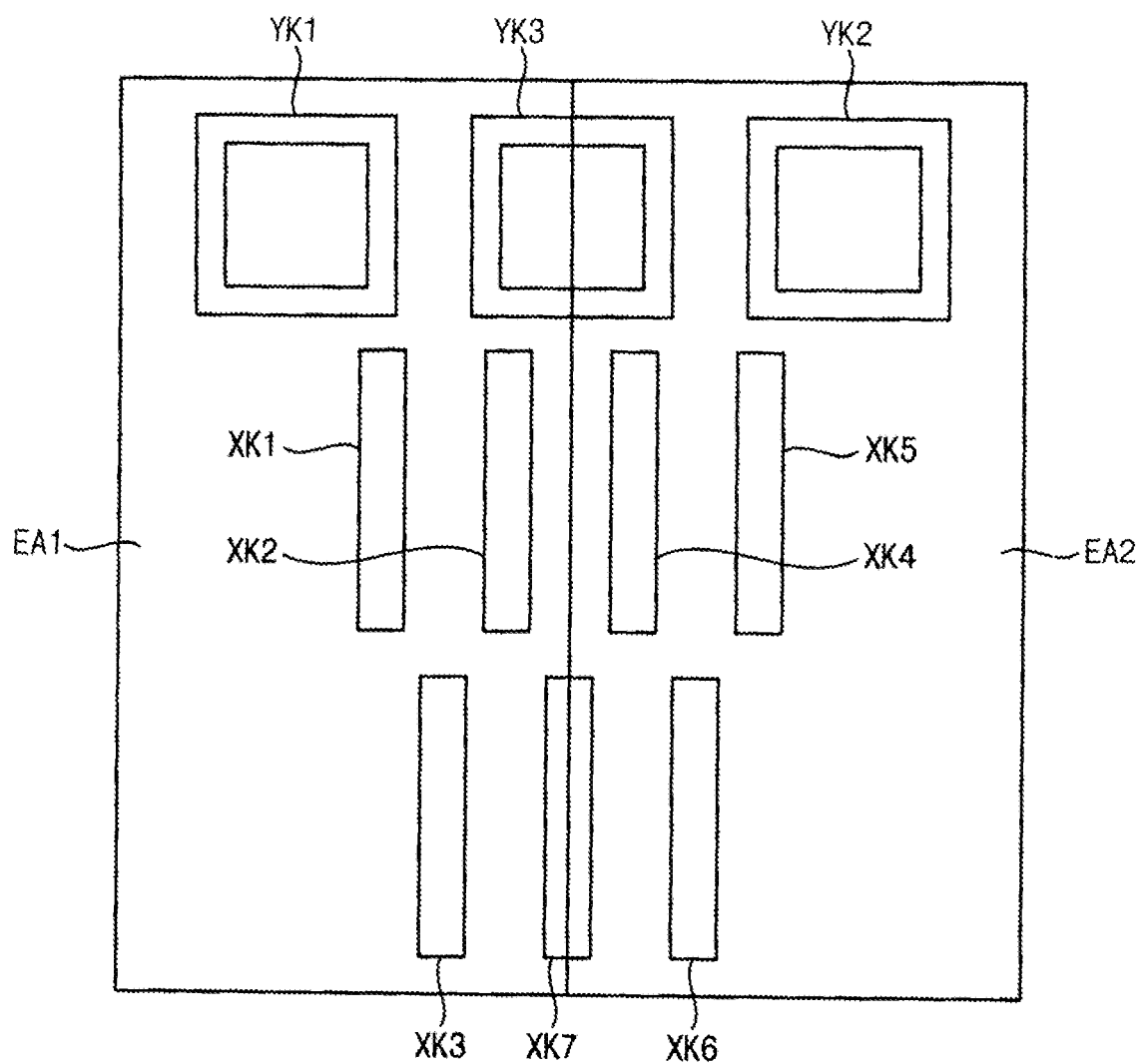
FIG. 12 is a plan view that illustrates an X-align-key and a Y-align-key of a graphic data system file used for a digital micro-mirror device of an exposure head according to an exemplary embodiment of the present inventive concept.

FIG. 12 is a plan view that illustrates an X-align-key and a Y-align-key of a graphic data system file used for a digital micro-mirror device of an exposure head according to an exemplary embodiment of the present inventive concept.

Referring to FIG. 12, a graphic data system file used for a digital micro-mirror device of an exposure head according to an exemplary embodiment of the present inventive concept includes an X-align-key and a Y-align-key. The Y-align-key may be disposed over the X-align-key in a plan view.

The X-align-key includes a first sub-X-align-key XK1, a second sub-X-align-key XK2 and a third sub-X-align-key XK3 disposed in a first exposure area EA1, a fourth sub-X-align-key XK4, a fifth sub-X-align-key XK5 and a sixth sub-X-align-key XK6 disposed in a second exposure area EA2 adjacent to the first exposure area EA1, and a seventh sub-X-align-key XK7 disposed on a boundary between the first exposure area EA1 and the second exposure area EA2. The fourth sub-X-align-key XK4, the fifth sub-X-align-key XK5 and the sixth sub-X-align-key XK6 are disposed symmetrically with the first sub-X-align-key XK1, the second sub-X-align-key XK2 and the third sub-X-align-key XK3 relative to the boundary between the first exposure area EA1 and the second exposure area EA2. The seventh sub-X-align-key XK7 has a shape that is symmetric relative to the boundary between the first exposure area EA1 and the second exposure area EA2.

The first to the seventh sub-X-align-keys XK1, XK2, XK3, XK4, XK5, XK6 and XK7 may have the same width. The first to the seventh sub-X-align-keys XK1, XK2, XK3, XK4, XK5, XK6 and XK7 may have a bar shape in a plan view.

The first sub-X-align-key XK1, the second sub-X-align-key XK2, the fourth sub-X-align-key XK4 and the fifth sub-X-align-key XK5 may be disposed in a first column. The third sub-X-align-key XK3, the sixth sub-X-align-key XK6, and the seventh sub-X-align-keys XK7 may be disposed in a second column. The sub-X-align keys in each column extend in a direction parallel to the scan direction of the exposure head 31.

Since the seventh sub-X-align-key XK7 has a shape that is symmetric relative to the boundary between the first exposure area EA1 and the second exposure area EA2, a portion of the seventh sub-X-align-key XK7 disposed in the first exposure area EA1 and a portion of the seventh sub-X-align-key XK7 disposed in the second exposure area EA2 may have the same area.

When aligned exposure heads expose the first exposure area EA1 and the second exposure area EA2, a width of a pattern formed by the seventh sub-X-align-key XK7 may be the same as the widths of patterns formed by the first to the sixth sub-X-align-keys XK1, XK2, XK3, XK4, XK5 and XK6. However, when misaligned exposure heads expose the first exposure area EA1 and the second exposure area EA2, a width of a pattern formed by the seventh sub-X-align-key XK7 may differ from the widths of patterns formed by the first to the sixth sub-X-align-keys XK1, XK2, XK3, XK4, XK5 and XK6.

Therefore, a misalignment of an X-component may be found by comparing the width of a pattern formed by the seventh sub-X-align-key XK7 with the widths of patterns formed by the first to the sixth sub-X-align-keys XK1, XK2, XK3, XK4, XK5 and XK6.

The Y-align-key includes a first sub-Y-align-key YK1 disposed in the first exposure area EA1, a second sub-Y-align-key YK2 disposed in the second exposure area EA2 adjacent to the first exposure area EA1 and a third sub-Y-align-key YK3 disposed on the boundary between the first exposure area EA1 and the second exposure area EA2. The second sub-Y-align-key YK2 is disposed symmetrically with the first sub-Y-align-key YK1 relative to the boundary between the first exposure area EA1 and the second exposure area EA2. The third sub-Y-align-key YK3 has a shape that is symmetric relative to the boundary between the first exposure area EA1 and the second exposure area EA2.

The first sub-Y-align-key YK1, the second sub-Y-align-key YK2 and the third sub-Y-align-key YK3 may have the same shape. The first sub-Y-align-key YK1, the second sub-Y-align-key YK2 and the third sub-Y-align-key YK3 may have a frame shape in a plan view.

Since the third sub-Y-align-key YK3 has a shape that is symmetric relative to the boundary between the first exposure area EA1 and the second exposure area EA2, a portion of the third sub-Y-align-key YK3 disposed in the first exposure area EA1 and a portion of the third sub-Y-align-key YK3 disposed in the second exposure area EA2 may have the same area.

When aligned exposure heads expose the first exposure area EA1 and the second exposure area EA2, a shape of a pattern formed by the third sub-Y-align-key YK3 may be the same as the shapes of patterns formed by the first sub-Y-align-key YK1 and the second sub-Y-align-key YK2. However, when misaligned exposure heads expose the first exposure area EA1 and the second exposure area EA2, a shape of a pattern formed by the third sub-Y-align-key YK3 may differ from the shapes of patterns formed by the first sub-Y-align-key YK1 and the second sub-Y-align-key YK2.

Therefore, a misalignment of a Y-component may be found by comparing the shape of a pattern formed by the third sub-Y-align-key YK3 with the shapes of patterns formed by the first sub-Y-align-key YK1 and the second sub-Y-align-key YK2.

Figure 13:
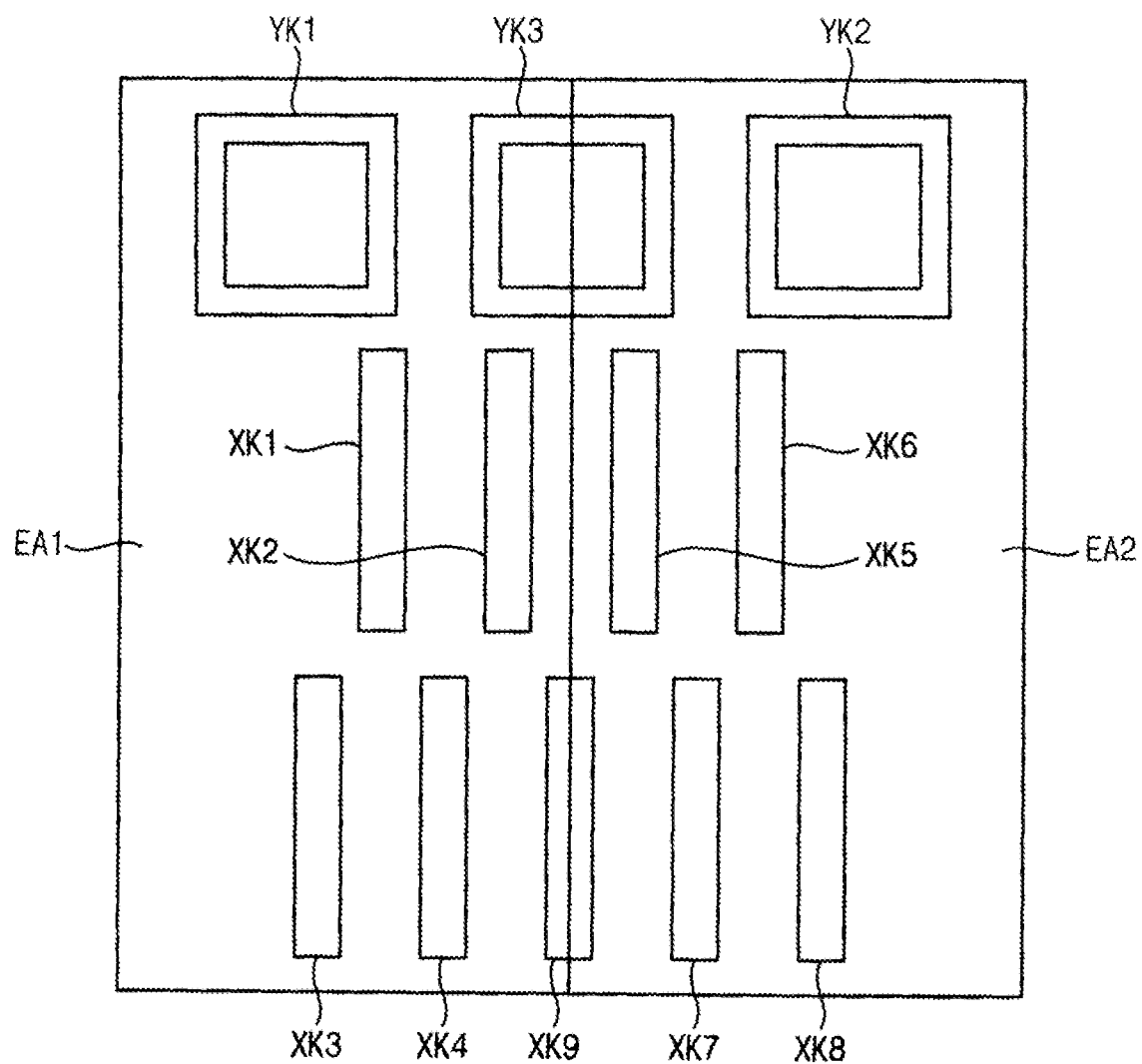
FIG. 13 is a plan view that illustrates an X-align-key and a Y-align-key of a graphic data system file used for a digital micro-mirror device of an exposure head according to an exemplary embodiment of the present inventive concept.

FIG. 13 is a plan view that illustrates an X-align-key and a Y-align-key of a graphic data system file used for a digital micro-mirror device of an exposure head according to an exemplary embodiment of the present inventive concept.

Referring to FIG. 13, a graphic data system file used for a digital micro-mirror device of an exposure head according to an exemplary embodiment of the present inventive concept includes an X-align-key and a Y-align-key. The Y-align-key may be disposed over the X-align-key in a plan view.

The X-align-key includes a first sub-X-align-key XK1, a second sub-X-align-key XK2, a third sub-X-align-key XK3 and a fourth sub-X-align-key XK4 disposed in a first exposure area EA1, a fifth sub-X-align-key XK5, a sixth sub-X-align-key XK6, a seventh sub-X-align-key XK7 and a eighth sub-X-align-key XK8 disposed in a second exposure area EA2 adjacent to the first exposure area EA1, and a ninth sub-X-align-key XK9 disposed on a boundary between the first exposure area EA1 and the second exposure area EA2. The fifth sub-X-align-key XK5, the sixth sub-X-align-key XK6, the seventh sub-X-align-key XK7 and the eighth sub-X-align-key XK8 are disposed symmetrically with the first sub-X-align-key XK1, the second sub-X-align-key XK2, the third sub-X-align-key XK3 and the fourth sub-X-align-key XK4 relative to the boundary between the first exposure area EA1 and the second exposure area EA2. The ninth sub-X-align-key XK9 has a shape that is symmetric relative to the boundary between the first exposure area EA1 and the second exposure area EA2.

The first to the ninth sub-X-align-keys XK1, XK2, XK3, XK4, XK5, XK6, XK7, XK8 and XK9 may have the same width. The first to the ninth sub-X-align-keys XK1, XK2, XK3, XK4, XK5, XK6, XK7, XK8 and XK9 may have a bar shape in a plan view.

The first sub-X-align-key XK1, the second sub-X-align-key XK2, the fifth sub-X-align-key XK5 and the sixth sub-X-align-key XK6 may be disposed in a first column. The third sub-X-align-key XK3, the fourth sub-X-align-key XK4, the seventh sub-X-align-key XK7, the eighth sub-X-align-key XK8, and the ninth sub-X-align-keys XK9 may be disposed in a second column. The sub-X-align keys in each column extend in a direction parallel to the scan direction of the exposure head 31.

Since the ninth sub-X-align-key XK9 has a shape that is symmetric relative to the boundary between the first exposure area EA1 and the second exposure area EA2, a portion of the ninth sub-X-align-key XK9 disposed in the first exposure area EA1 and a portion of the ninth sub-X-align-key XK9 disposed in the second exposure area EA2 may have the same area.

When aligned exposure heads expose the first exposure area EA1 and the second exposure area EA2, a width of a pattern formed by the ninth sub-X-align-key XK9 may be the same as the widths of patterns formed by the first to the eighth sub-X-align-keys XK1, XK2, XK3, XK4, XK5, XK6, XK7 and XK8. However, when misaligned exposure heads expose the first exposure area EA1 and the second exposure area EA2 with misalignment, a width of a pattern formed by the ninth sub-X-align-key XK9 may differ from the widths of pattern formed by the first to the eighth sub-X-align-keys XK1, XK2, XK3, XK4, XK5, XK6, XK7 and XK8.

Therefore, a misalignment of an X-component may be found by comparing the width of a pattern formed by the ninth sub-X-align-key XK9 with the widths of patterns formed by the first to the eighth sub-X-align-keys XK1, XK2, XK3, XK4, XK5, XK6, XK7 and XK8.

The Y-align-key includes a first sub-Y-align-key YK1 disposed in the first exposure area EA1, a second sub-Y-align-key YK2 disposed in the second exposure area EA2 adjacent to the first exposure area EA1 and a third sub-Y-align-key YK3 disposed on the boundary between the first exposure area EA1 and the second exposure area EA2. The second sub-Y-align-key YK2 is disposed symmetrically with the first sub-Y-align-key YK1 relative to the boundary between the first exposure area EA1 and the second exposure area EA2. The third sub-Y-align-key YK3 has a shape that is symmetric relative to the boundary between the first exposure area EA1 and the second exposure area EA2.

The first sub-Y-align-key YK1, the second sub-Y-align-key YK2 and the third sub-Y-align-key YK3 may have the same shape. The first sub-Y-align-key YK1, the second sub-Y-align-key YK2 and the third sub-Y-align-key YK3 may have a frame shape in a plan view.

Since the third sub-Y-align-key YK3 has a shape that is symmetric relative to the boundary between the first exposure area EA1 and the second exposure area EA2, a portion of the third sub-Y-align-key YK3 disposed in the first exposure area EA1 and a portion of the third sub-Y-align-key YK3 disposed in the second exposure area EA2 may have the same area.

When aligned exposure heads expose the first exposure area EA1 and the second exposure area EA2, a shape of a pattern formed by the third sub-Y-align-key YK3 may be the same as the shapes of patterns formed by the first sub-Y-align-key YK1 and the second sub-Y-align-key YK2. However, when misaligned exposure heads expose the first exposure area EA1 and the second exposure area EA2, a shape of a pattern formed by the third sub-Y-align-key YK3 may differ from the shapes of patterns formed by the first sub-Y-align-key YK1 and the second sub-Y-align-key YK2.

Therefore, a misalignment of a Y-component may be found by comparing the shape of a pattern formed by the third sub-Y-align-key YK3 with the shapes of patterns formed by the first sub-Y-align-key YK1 and the second sub-Y-align-key YK2.

Figure 14:
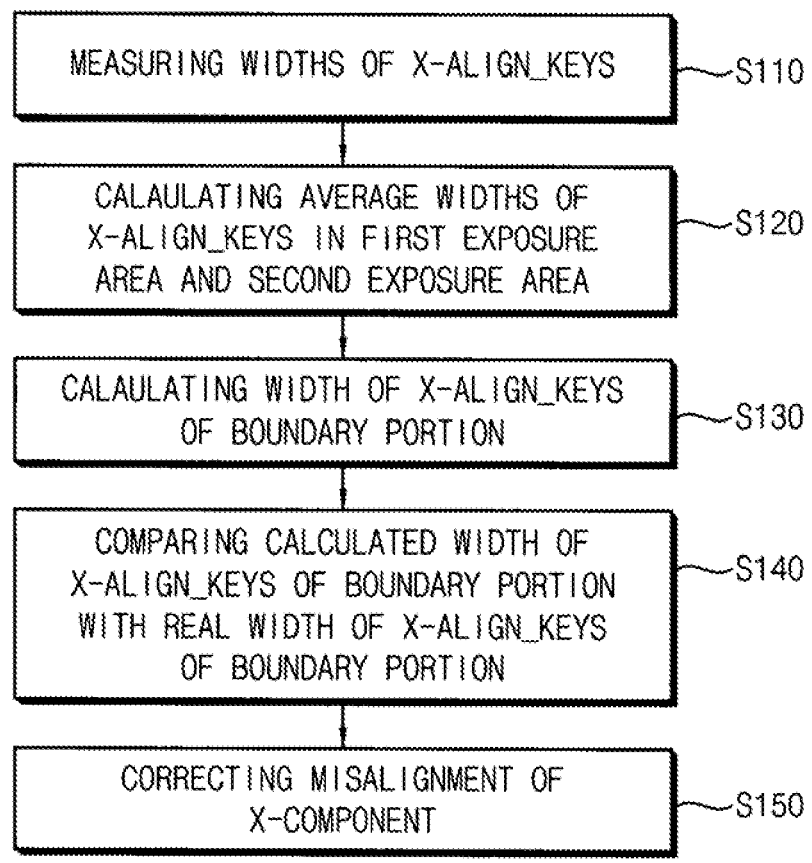
FIG. 14 is a block diagram that illustrates a method of correcting misalignment of an X-component according to an exemplary embodiment of the present inventive concept.

FIG. 14 is a block diagram that illustrates a method of correcting misalignment of an X-component according to an exemplary embodiment of the present inventive concept.

Referring to FIG. 14, a method of correcting misalignment of an X-component according to an exemplary embodiment of the present inventive concept includes measuring the widths of the first to $n^{th}$ X-align-key patterns formed using the first to $n^{th}$ sub-X-align-keys S110, calculating an average of the widths of the X-align-key patterns formed in the first exposure area and an average of the widths of the X-align-key patterns formed in the second exposure area S120, calculating a target width of an X-align-key pattern on the boundary between the first exposure area and the second exposure area S130, comparing the target width of the X-align-key pattern with the width of a real X-align-key pattern S140, and generating a first correction data that corrects a misalignment an X-component by using difference between the target width X-align-key pattern and the width of the X-align-key pattern on the boundary of the exposure areas S150.

The widths of the first to $n^{th}$ X-align-key patterns formed using the first to $n^{th}$ sub-X-align-keys are measured. Thereafter, an average of the widths of the X-align-key patterns formed in the first exposure area and an average of the widths of the X-align-key patterns formed in the second exposure area are calculated.

In the process S120 of calculating an average width of the X-align-key patterns formed in the first exposure area and an average width of the X-align-key patterns formed in the second exposure area, if the number of X-align-key patterns is seven, an average width of the first to the third X-align-key patterns and an average width of the fourth to the sixth X-align-key patterns are calculated. Alternatively, if the number of X-align-key patterns is nine, an average width of the first to the fourth X-align-key patterns and an average width of the fifth to the eighth X-align-key patterns are calculated In the process S130 of calculating a target width of an X-align-key pattern on the boundary between the first exposure area and the second exposure area, a target width of an X-align-key pattern on the boundary between the first exposure area and the second exposure area may be calculated by using the average width of the first to third align-key patterns and the average width of the fourth to sixth align-key patterns. For example, if the number of the X-align-key patterns is seven, the target width of an X-align-key pattern on the boundary between the first exposure area and the second exposure area may be one half of the sum of the average width of the first to third X-align-key patterns and the average width of the fourth to sixth X-align-key patterns. Alternatively, if the number of the X-align-key patterns is nine, the target width of an X-align-key pattern on the boundary between the first exposure area and the second exposure area may be one half of the sum of the average width of the first to fourth X-align-key patterns and the average width of the fifth to eighth X-align-key patterns.

In the process S140 of comparing the target width of the X-align-key pattern with the width of a real X-align-key pattern, the target width of the X-align-key pattern is compared with the width of a real X-align-key pattern.

For example, if the number of X-align-key patterns is seven, the target width of the X-align-key pattern is compared with the width of the seventh X-align-key pattern. At this time, if the width of the seventh X-align-key pattern is narrower than the target width of the X-align-key pattern, it is determined that a space between scans became narrower. Alternatively, if the width of the seventh X-align-key pattern is wider than the target width of the X-align-key pattern, it is determined that a space between scans became wider.

Therefore, if the width of the seventh X-align-key pattern is narrower than the target width of the X-align-key pattern, correction data that can increase the space between scans may be generated. If the width of the seventh X-align-key pattern is wider than the target width of the X-align-key pattern, correction data that can decrease the space between scans may be generated.

Alternatively, if the number of X-align-key patterns is nine, the target width of the X-align-key pattern is compared with the width of the ninth X-align-key pattern. At this time, if the width of the ninth X-align-key pattern is narrower than the target width of the X-align-key pattern, it is determined that a space between scans became narrower. On the other hand, if the width of the ninth X-align-key pattern is wider than the target width of the X-align-key pattern, it is determined that a space between scans became wider.

Therefore, if the width of the ninth X-align-key pattern is narrower than the target width of the X-align-key pattern, correction data that can increase the space between scans may be generated. If the width of the ninth X-align-key pattern is wider than the target width of the X-align-key pattern, correction data that can decrease the space between scans may be generated.

Figure 15:
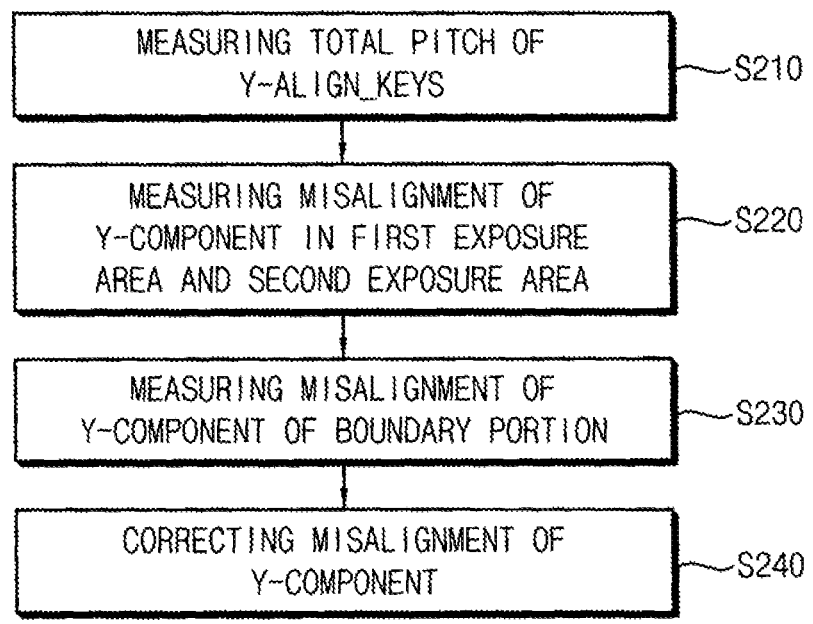
FIG. 15 is a block diagram that illustrates a method of correcting misalignment of a Y-component according to an exemplary embodiment of the present inventive concept.

FIG. 15 is a block diagram that illustrates a method of correcting misalignment of a Y-component according to an exemplary embodiment of the present inventive concept.

Referring to FIG. 15, a method of correcting misalignment of a Y-component according to an exemplary embodiment of the present inventive concept includes measuring the total pitches of the first to third Y-align-key patterns formed by using the first to third sub-Y-align-keys S210, measuring misalignment values of the Y-align-key patterns formed in the first exposure area and the Y-align-key patterns formed in the second exposure area S220, measuring the misalignment value of the Y-align-key pattern formed on a boundary between the first exposure area and the second exposure area S230, and generating a second correction data that can correct the misalignment of the Y-component S240.

In the process S210 of measuring the total pitches of a first to $n^{th}$ Y-align-key patterns formed using the first to $n^{th}$ sub-Y-align-keys S210, the total pitches of the first to $n^{th}$ Y-align-key patterns formed using the first to $n^{th}$ sub-Y-align-keys are measured.

In the process S220 of measuring misalignment values of the Y-align-key patterns formed in the first exposure area and the Y-align-key patterns formed in the second exposure area S220, the misalignment value is measured by comparing a Y-align-key of a graphic data system file used for a digital micro-mirror device of an exposure head with the first and the second Y-align-key patterns.

Thereafter, the misalignment value of the third Y-align-key pattern formed on the boundary between the first exposure area and the second exposure area is measured. Accordingly, second correction data correcting the misalignment of Y-component is generated using the misalignment values of the first and the second Y-align-key patterns and the misalignment value of the third Y-align-key pattern.

The misalignment of the Y-component may occur for every scan. Therefore, a misalignment of a second scan S2 may be corrected on the basis of a start point of a first scan S1. Thereafter, a misalignment of a third scan S3 may be corrected on the basis of a corrected start point of the second scan S2. That is, the misalignment of a scan may be corrected on the basis of a start point of a previous scan.

Figure 16:
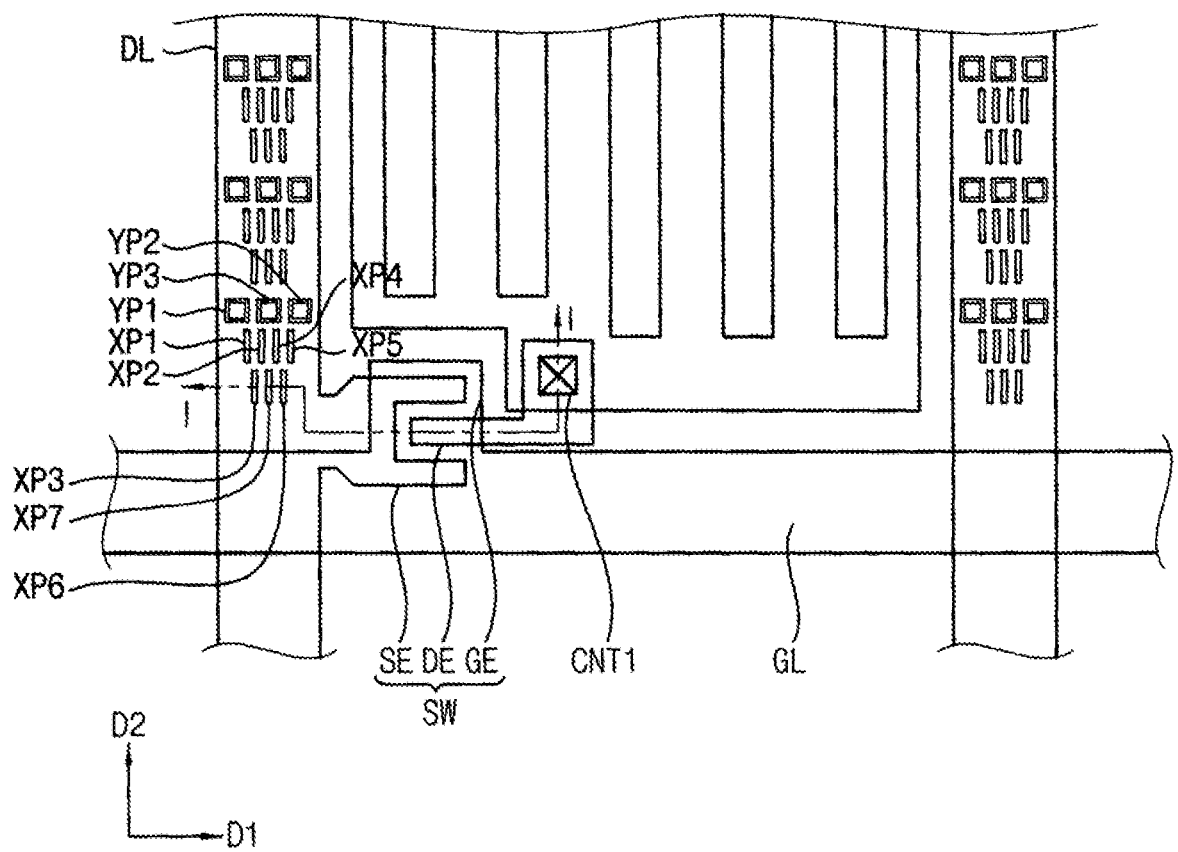
FIG. 16 is a plan view that illustrates a display substrate manufactured by a maskless exposure device according to an exemplary embodiment of the present inventive concept.
Figure 17:
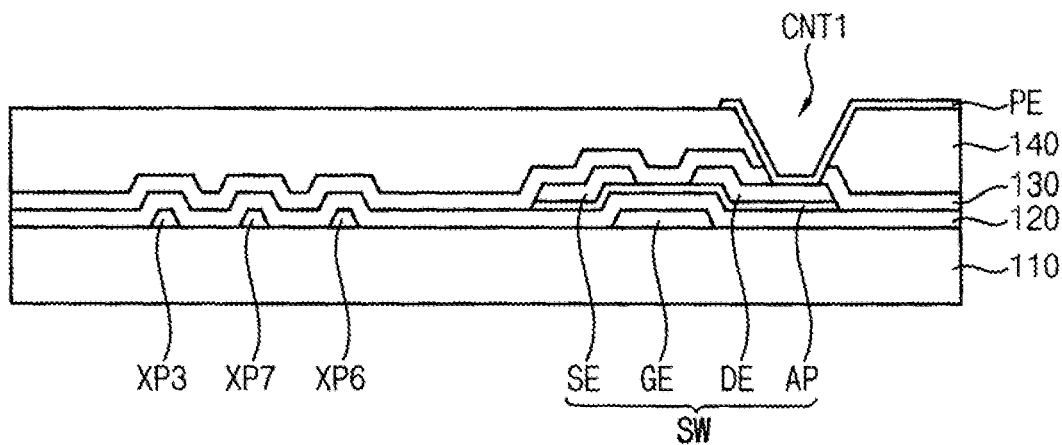
FIG. 17 is a cross-sectional view taken along the line I-I' of FIG. 16.

FIG. 16 is a plan view that illustrates a display substrate manufactured by a maskless exposure device according to an exemplary embodiment of the present inventive concept. FIG. 17 is a cross-sectional view taken along line I-I' of FIG. 16.

Referring to FIGS. 16 and 17, a display substrate includes a base substrate 110, a gate line GL, a data line DL, a gate electrode GE, a source electrode SE, a drain electrode DE, an active pattern AP, a pixel electrode PE, a first insulation layer 120, a second insulation layer 130, an organic layer 140, an X-align-key pattern and a Y-align-key pattern. The gate electrode GE, source electrode SE, drain electrode DE, and active pattern AP form a switching element SW.

The X-align-key pattern may include a first to a seventh sub-X-align-key patterns XP1, XP2, XP3, XP4, XP5, XP6 and XP7. The Y-align-key pattern may include a first to a third sub-Y-align-key patterns YP1, YP2 and YP3.

Examples of the base substrate 110 may include a glass substrate, a quartz substrate, a silicon substrate, a plastic substrate and the like.

The gate line GL is disposed on the base substrate 110. The gate line GL extends in a first direction D1. The gate line GL may have a single layer structure that may include copper (Cu), silver (Ag), chrome (Cr), molybdenum (Mo), aluminum (Al), titanium (Ti), manganese (Mn), or a mixture thereof. Alternatively, the gate line GL may have a multi layer structure with a plurality of layers that include different materials. For example, the gate line GL may include a copper layer and a titanium layer disposed on and/or under the copper layer.

The gate electrode GE is disposed on the base substrate 110. The gate electrode GE is electrically connected to the gate line GL. The gate electrode GE may have a single layer structure that may include copper (Cu), silver (Ag), chrome (Cr), molybdenum (Mo), aluminum (Al), titanium (Ti), manganese (Mn), or a mixture thereof. Alternatively, the gate electrode GE may have a multi layer structure with a plurality of layers that include different materials. For example, the gate electrode GE may include a copper layer and a titanium layer disposed on and/or under the copper layer.

The first insulation layer 120 is formed on the gate electrode GE. The first insulation layer 120 may cover the base substrate 110 and a first conductive pattern that includes the gate electrode GE. The first insulation layer 120 may include an inorganic material such as silicon oxide (SiOx) and/or silicon nitride (SiNx). For example, the first insulation layer 120 may include silicon oxide (SiOx), and may have a thickness of about 500 Å. In addition, the first insulation layer 120 may include a plurality of layers that include different materials.

An active pattern AP is formed on the first insulation layer 120. The active pattern AP is formed on the first insulation layer 120 in an area in which the gate electrode GE is formed. The active pattern AP may overlap the gate electrode GE. The active pattern AP may partially overlap the source electrode SE and the drain electrode DE. The active pattern AP may be disposed between the gate electrode GE and the source electrode SE. The active pattern may be disposed between the gate electrode GE and the drain electrode DE. The data line DL is formed on the active pattern AP. The data line DL extends in a second direction D2 crossing the first direction D1. The data line DL may have a recess disposed adjacent to the gate line GL. The data line DL may have a single layer structure that may include copper (Cu), silver (Ag), chrome (Cr), molybdenum (Mo), aluminum (Al), titanium (Ti), manganese (Mn), or a mixture thereof. Alternatively, the data line DL may have a multi layer structure with a plurality of layers that include different materials. For example, the data line DL may include a copper layer and a titanium layer disposed on and/or under the copper layer. The data line DL may have a thickness of about 6000 Å.

The source electrode SE and the drain electrode DE may be formed on the active pattern AP. The source electrode SE and the drain electrode DE may be spaced apart from each other. The source electrode SE and the drain electrode DE may be formed from the same layer as the data line DL.

The source electrode SE and the drain electrode DE may have a single layer structure that may include copper (Cu), silver (Ag), chrome (Cr), molybdenum (Mo), aluminum (Al), titanium (Ti), manganese (Mn), or a mixture thereof. Alternatively, the source electrode SE and the drain electrode DE may have a multi layer structure with a plurality of layers that include different materials. For example, the source electrode SE and the drain electrode DE may include a copper layer and a titanium layer disposed on and/or under the copper layer.

The second insulation layer 130 may be formed on the source electrode SE and the drain electrode DE. The second insulation layer 130 may be formed with a material that includes silicon oxide (SiOx) or silicon nitride (SiNx).

The organic layer 140 is disposed on the second insulation layer 130. The organic layer 140 planarizes an upper surface of the substrate to prevent signal line disconnections due to a step. The organic layer 140 may be an insulation layer that includes an organic material. The organic layer 140 may be a color filter.

The pixel electrode PE is formed on the organic layer 140. The pixel electrode PE may be electrically connected with the drain electrode DE through a first contact hole CNT1. The pixel electrode PE may include a transparent conductive material, such as indium tin oxide (ITO) or indium zinc oxide (IZO). In addition, the pixel electrode PE may include titanium (Ti) and/or molybdenum titanium (MoTi).

The X-align-key pattern and the Y-align-key pattern are formed on the base substrate 110.

The X-align-key pattern may include a first to seventh sub-X-align-key patterns XP1, XP2, XP3, XP4, XP5, XP6 and XP7. The Y-align-key pattern may include a first to third sub-Y-align-key patterns YP1, YP2 and YP3.

Each of the first to the seventh sub-X-align-key patterns XP1, XP2, XP3, XP4, XP5, XP6 and XP7 extends in the second direction D2. Each of the first to seventh sub-X-align-key patterns XP1, XP2, XP3, XP4, XP5, XP6 and XP7 may have a bar shape. The first to seventh sub-X-align-key patterns XP1, XP2, XP3, XP4, XP5, XP6 and XP7 may be disposed on the same layer as the gate line GL and the gate electrode GE. The first to the seventh sub-X-align-key patterns XP1, XP2, XP3, XP4, XP5, XP6 and XP7 may overlap the data line DL in a plan view.

Each of the first to third sub-Y-align-key patterns YP1, YP2 and YP3 may have a frame shape. The first to third sub-Y-align-key patterns YP1, YP2 and YP3 may be disposed adjacent to the first to seventh sub-X-align-key patterns XP1, XP2, XP3, XP4, XP5, XP6 and XP7. The first to third sub-Y-align-key patterns YP1, YP2 and YP3 may be disposed on the same layer as the gate line GL and the gate electrode GE. The first to third sub-Y-align-key patterns YP1, YP2 and YP3 may overlap the data line DL in a plan view.

FIGS. 18 to 21 are cross-sectional views that illustrate a method of manufacturing a display substrate of FIG. 17.

Figure 18:
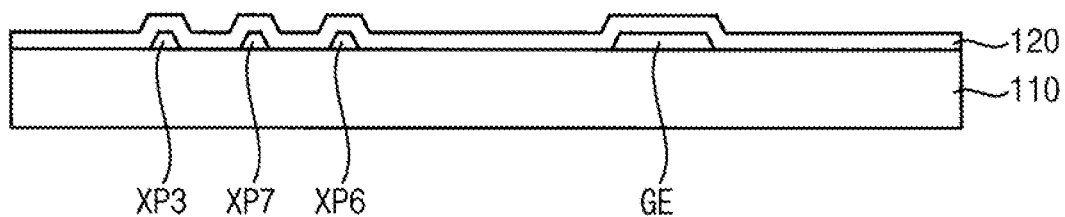
FIGS. 18 to 21 are cross-sectional views that illustrate a method of manufacturing a display substrate of FIG. 17.

Referring to FIG. 18, the gate electrode GE, the third sub-X-align-key pattern XP3, the sixth sub-X-align-key pattern XP6 and the seventh sub-X-align-key pattern XP7 are formed on the base substrate 110. Thereafter, the first insulation layer 120 is formed on the base substrate 110 on which the gate electrode GE, the third sub-X-align-key pattern XP3, the sixth sub-X-align-key pattern XP6 and the seventh sub-X-align-key pattern XP7 are formed.

The gate electrode GE, the third sub-X-align-key pattern XP3, the sixth sub-X-align-key pattern XP6 and the seventh sub-X-align-key pattern XP7 may be formed by patterning a first conductive layer. The first conductive layer may be formed through a sputtering process. The first conductive layer may have a single layer structure that may include copper (Cu), silver (Ag), chrome (Cr), molybdenum (Mo), aluminum (Al), titanium (Ti), manganese (Mn), or a mixture thereof. Alternatively, the first conductive layer may have a multi layer structure with a plurality of layers that include different materials. The first conductive layer may be a gate metal layer. The gate electrode GE, the third sub-X-align-key pattern XP3, the sixth sub-X-align-key pattern XP6 and the seventh sub-X-align-key pattern XP7 may be a gate metal pattern. The third sub-X-align-key pattern XP3, the sixth sub-X-align-key pattern XP6 and the seventh sub-X-align-key pattern XP7 may be disposed on the same layer as the gate electrode GE. The third sub-X-align-key pattern XP3, the sixth sub-X-align-key pattern XP6 and the seventh sub-X-align-key pattern XP7 may include the same material as the gate electrode GE. The third sub-X-align-key pattern XP3, the sixth sub-X-align-key pattern XP6 and the seventh sub-X-align-key pattern XP7 may be spaced apart from the gate electrode GE.

The first insulation layer 120 is formed on the base substrate 110 on which the gate electrode GE the third sub-X-align-key pattern XP3, the sixth sub-X-align-key pattern XP6 and the seventh sub-X-align-key pattern XP7 are formed. The first insulation layer 120 may include an inorganic material such as silicon oxide (SiOx) and/or silicon nitride (SiNx). For example, the first insulation layer 120 may include silicon oxide (SiOx), and may have a thickness of about 500 Å. In addition, the first insulation layer 120 may include a plurality of layers that include different materials.

Figure 19:
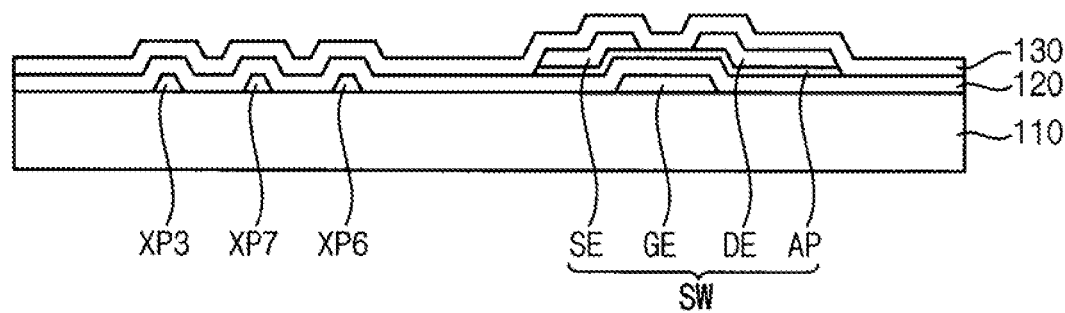

Referring to FIG. 19, a second conductive layer may be formed on the base substrate 110 on which the gate insulation layer 120 is formed. The second conductive layer may include a data metal layer and a semiconductor layer. The data metal layer may include the source electrode SE and the drain electrode DE.

The data metal layer may have a single layer structure that may include copper (Cu), silver (Ag), chrome (Cr), molybdenum (Mo), aluminum (Al), titanium (Ti), manganese (Mn), or a mixture thereof. Alternatively, the data metal layer may have a multi layer structure with a plurality of layers that include different materials. For example, the data metal layer may include a copper layer and a titanium layer disposed on and/or under the copper layer.

The semiconductor layer includes an oxide semiconductor. For example, the oxide semiconductor may include zinc oxide ("ZnO"), zinc tin oxide ("ZTO"), indium zinc oxide ("IZO"), indium oxide ("InO"), titanium oxide ("TiO"), indium gallium zinc oxide ("IGZO"), indium zinc tin oxide ("IZTO"), etc. These may be used alone or in a combination thereof.

The source electrode SE, the drain electrode DE and the data line DL may be formed by patterning the second conductive layer. Thereafter, the second insulation layer 130 is formed on the base substrate 110 on which the source electrode SE, the drain electrode DE and the data line DL are formed.

The source electrode SE and the drain electrode DE may have a single layer structure that may include copper (Cu), silver (Ag), chrome (Cr), molybdenum (Mo), aluminum (Al), titanium (Ti), manganese (Mn), or a mixture thereof. Alternatively, the source electrode SE and the drain electrode DE may have a multi layer structure with a plurality of layers that include different materials. For example, the source electrode SE and the drain electrode DE may include a copper layer and a titanium layer disposed on and/or under the copper layer.

Figure 20:
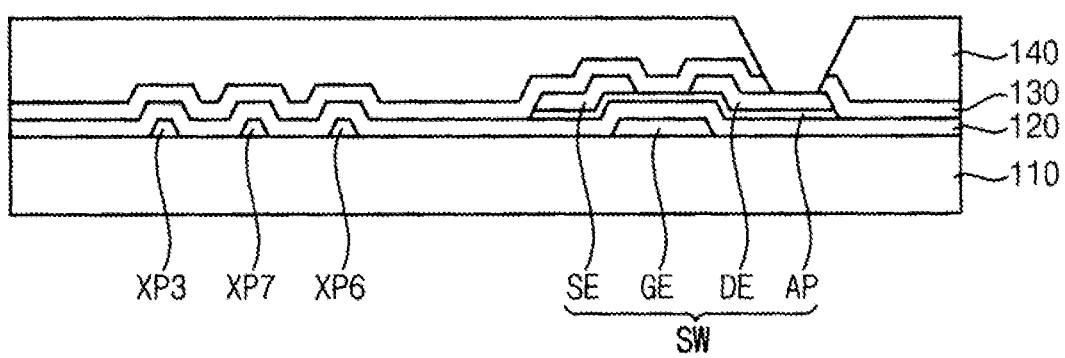

Referring to FIG. 20, the organic layer 140 is disposed on the second insulation layer 130. The organic layer 140 planarizes an upper surface of the substrate to prevent signal line disconnections due to the. The organic layer 140 may be an insulation layer that includes an organic material. The organic layer 140 may a color filter.

Thereafter, the first insulation layer 120, the second insulation layer 130 and the organic layer 140 are patterned. Therefore, the drain electrode DE is partially exposed.

A first contact hole CNT1 is formed through the organic layer 140 and the second insulation layer 130, so that the first contact hole CNT1 partially exposes the drain electrode DE.

Figure 21:
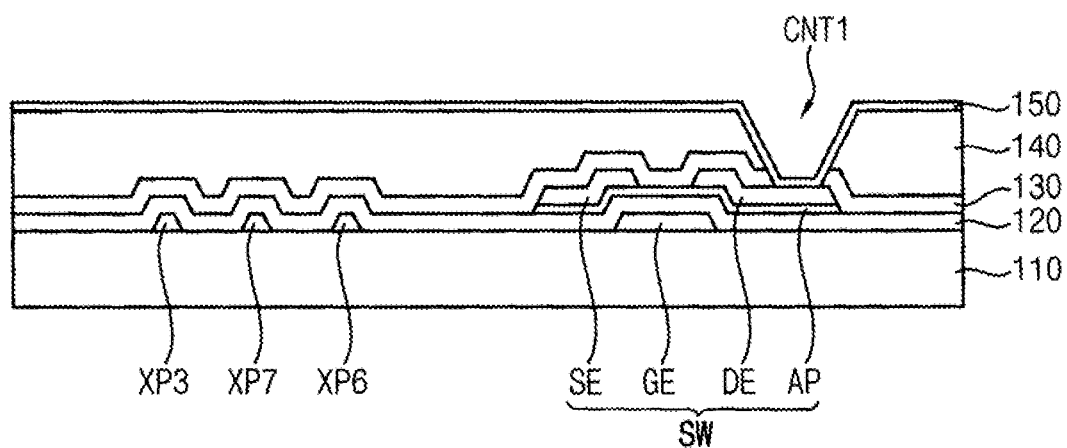

Referring to FIG. 21, a transparent conductive layer 150 is formed on the patterned organic layer 140.

The transparent conductive layer 150 may include a transparent conductive material, such as indium tin oxide (ITO) and indium zinc oxide (IZO). In addition, the transparent conductive layer 150 may include titanium (Ti) and/or molybdenum titanium (MoTi).

Referring to FIG. 17, the transparent conductive layer 150 is patterned to form the pixel electrode PE.

The pixel electrode PE may include a transparent conductive material, such as indium tin oxide (ITO) and indium zinc oxide (IZO). In addition, the pixel electrode PE may include titanium (Ti) and/or molybdenum titanium (MoTi). The pixel electrode PE may be electrically connected with the drain electrode DE. The pixel electrode PE may be electrically connected with the drain electrode DE through the first contact hole CNT1.

Figure 22:
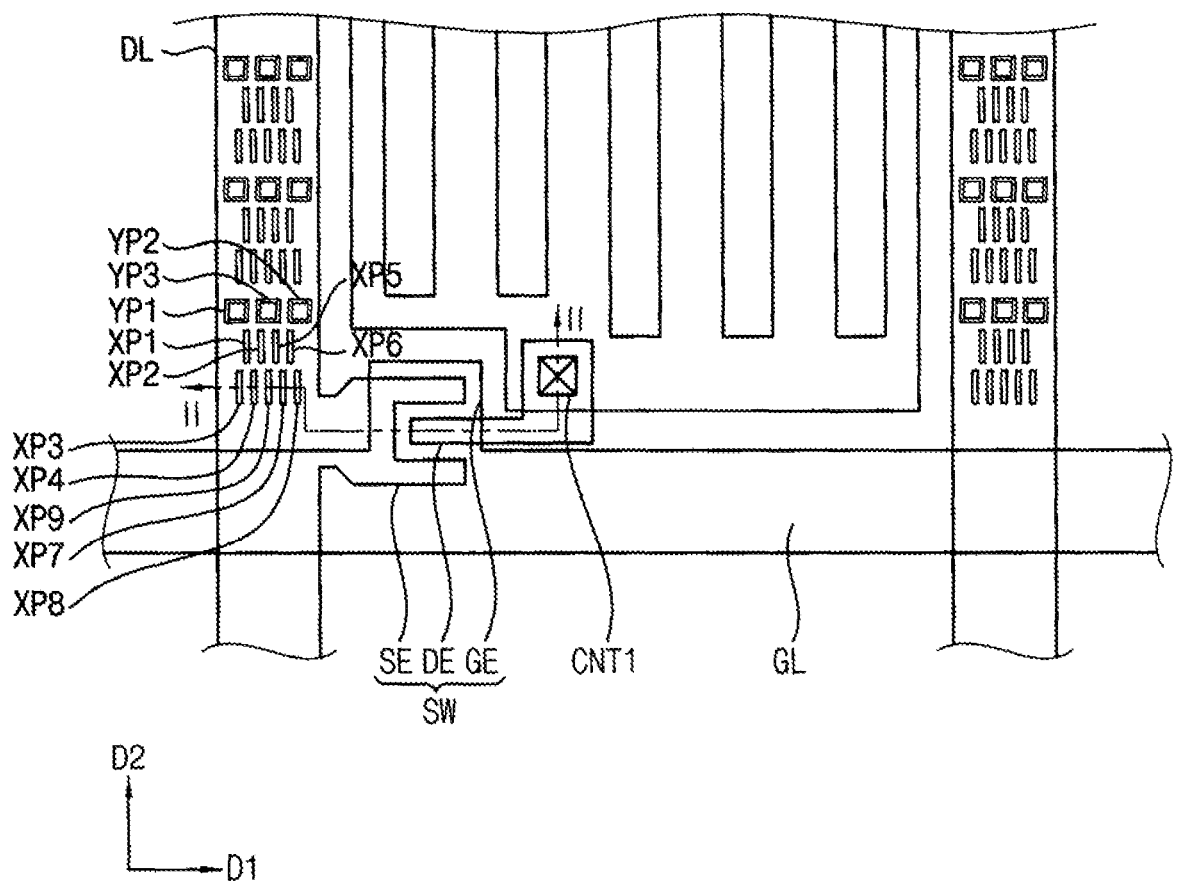
FIG. 22 is a plan view that illustrates a display substrate manufactured by a maskless exposure device according to an exemplary embodiment of the present inventive concept.
Figure 23:
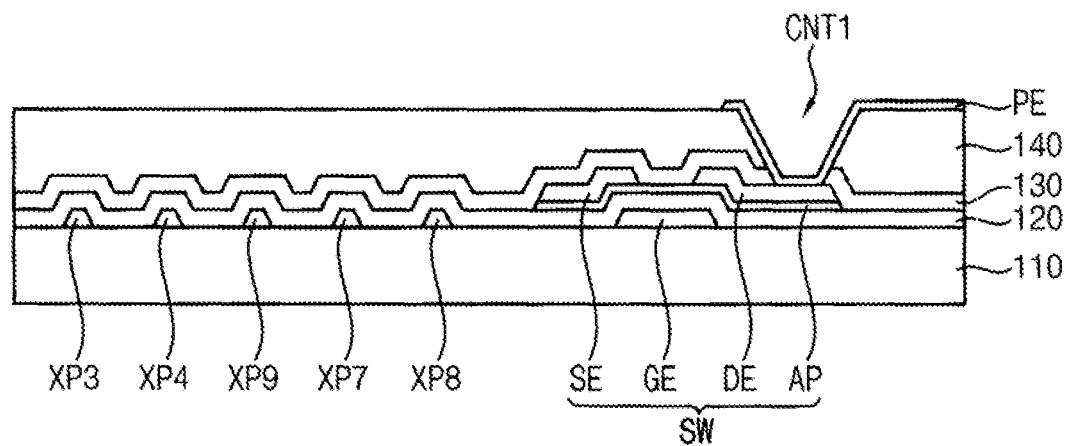
FIG. 23 is a cross-sectional view taken along the line II-II' of FIG. 22.

FIG. 22 is a plan view that illustrates a display substrate manufactured by a maskless exposure device according to an exemplary embodiment of the present inventive concept. FIG. 23 is a cross-sectional view taken along line II-II' of FIG. 22.

Referring to FIGS. 22 and 23, a display substrate includes a base substrate 110, a gate line GL, a data line DL, a gate electrode GE, a source electrode SE, a drain electrode DE, an active pattern AP, a pixel electrode PE, a first insulation layer 120, a second insulation layer 130, an organic layer 140, an X-align-key pattern and a Y-align-key pattern. The gate electrode GE, source electrode SE, drain electrode DE, and active pattern AP form a switching element SW.

The X-align-key pattern may include a first to ninth sub-X-align-key patterns XP1, XP2, XP3, XP4, XP5, XP6, XP7, XP8 and XP9. The Y-align-key pattern may include a first to third sub-Y-align-key patterns YP1, YP2 and YP3.

Examples of the base substrate 110 may include a glass substrate, a quartz substrate, a silicon substrate, a plastic substrate, etc.

The gate line GL is disposed on the base substrate 110. The gate line GL extends in a first direction D1. The gate line GL may have a single layer structure that may include copper (Cu), silver (Ag), chrome (Cr), molybdenum (Mo), aluminum (Al), titanium (Ti), manganese (Mn), or a mixture thereof. Alternatively, the gate line GL may have a multi layer structure with a plurality of layers that include different materials. For example, the gate line GL may include a copper layer and a titanium layer disposed on and/or under the copper layer.

The gate electrode GE is disposed on the base substrate 110. The gate electrode GE is electrically connected with the gate line GL. The gate electrode GE may have a single layer structure that may include copper (Cu), silver (Ag), chrome (Cr), molybdenum (Mo), aluminum (Al), titanium (Ti), manganese (Mn), or a mixture thereof. Alternatively, the gate electrode GE may have a multi layer structure with a plurality of layers that include different materials. For example, the gate electrode GE may include a copper layer and a titanium layer disposed on and/or under the copper layer.

The first insulation layer 120 is formed on the gate electrode GE. The first insulation layer 120 may cover the base substrate 110 and a first conductive pattern that includes the gate electrode GE. The first insulation layer 120 may include an inorganic material such as silicon oxide (SiOx) and/or silicon nitride (SiNx). For example, the first insulation layer 120 may include silicon oxide (SiOx), and may have a thickness of about 500 Å. Alternatively, the first insulation layer 120 may include a plurality of layers that include different materials.

An active pattern AP is formed on the first insulation layer 120. The active pattern AP is formed on the first insulation layer 120 in an area in which the gate electrode GE is formed. The active pattern AP may overlap the gate electrode GE. The active pattern AP may partially overlap the source electrode SE and the drain electrode DE. The active pattern AP may be disposed between the gate electrode GE and the source electrode SE. The active pattern may be disposed between the gate electrode GE and the drain electrode DE. The data line DL is formed on the active pattern AP. The data line DL extends in a second direction D2 crossing the first direction D1. The data line DL may have a recess disposed adjacent to the gate line GL. The data line DL may have a single layer structure that may include copper (Cu), silver (Ag), chrome (Cr), molybdenum (Mo), aluminum (Al), titanium (Ti), manganese (Mn), or a mixture thereof. Alternatively, the data line DL may have a multi layer structure with a plurality of layers that include different materials. For example, the data line DL may include a copper layer and a titanium layer disposed on and/or under the copper layer. The data line DL may have a thickness as 6000 Å.

The source electrode SE and the drain electrode DE may be formed on the active pattern AP. The source electrode SE and the drain electrode DE may be spaced apart from each other. The source electrode SE and the drain electrode DE may be formed from the same layer as the data line DL.

The source electrode SE and the drain electrode DE may have a single layer structure that may include copper (Cu), silver (Ag), chrome (Cr), molybdenum (Mo), aluminum (Al), titanium (Ti), manganese (Mn), or a mixture thereof. Alternatively, the source electrode SE and the drain electrode DE may have a multi layer structure with a plurality of layers that include different materials. For example, the source electrode SE and the drain electrode DE may include a copper layer and a titanium layer disposed on and/or under the copper layer.

The second insulation layer 130 may be formed on the source electrode SE and the drain electrode DE. The second insulation layer 130 may be formed with a material that includes silicon oxide (SiOx) or silicon nitride (SiNx).

The organic layer 140 is disposed on the second insulation layer 130. The organic layer 140 planarizes an upper surface of the substrate to prevent signal line disconnections due to a. The organic layer 140 may be an insulation layer that includes an organic material. The organic layer 140 may a color filter.

The pixel electrode PE is formed on the organic layer 140. The pixel electrode PE may be electrically connected with the drain electrode DE through a first contact hole CNT1. The pixel electrode PE may include a transparent conductive material, such as indium tin oxide (ITO) and indium zinc oxide (IZO). In addition, the pixel electrode PE may include titanium (Ti) and/or molybdenum titanium (MoTi).

The X-align-key pattern and the Y-align-key pattern are formed on the base substrate 110.

The X-align-key pattern may include a first to ninth sub-X-align-key patterns XP1, XP2, XP3, XP4, XP5, XP6, XP7, XP8 and XP9. The Y-align-key pattern may include a first to third sub-Y-align-key patterns YP1, YP2 and YP3.

Each of the first to ninth sub-X-align-key patterns XP1, XP2, XP3, XP4, XP5, XP6, XP7, XP8 and XP9 extends in a second direction. Each of the first to ninth sub-X-align-key patterns XP1, XP2, XP3, XP4, XP5, XP6, XP7, XP8 and XP9 may have a bar shape. The first to ninth sub-X-align-key patterns XP1, XP2, XP3, XP4, XP5, XP6, XP7, XP8 and XP9 may be disposed on the same layer as the gate line GL and the gate electrode GE. The first to ninth sub-X-align-key patterns XP1, XP2, XP3, XP4, XP5, XP6, XP7, XP8 and XP9 may overlap the data line DL in a plan view.

Each of the first to third sub-Y-align-key patterns YP1, YP2 and YP3 may have a frame shape. The first to third sub-Y-align-key patterns YP1, YP2 and YP3 may be disposed adjacent to the first to ninth sub-X-align-key patterns XP1, XP2, XP3, XP4, XP5, XP6, XP7, XP8 and XP9. The first to third sub-Y-align-key patterns YP1, YP2 and YP3 may be disposed on the same layer as the gate line GL and the gate electrode GE. The first to third sub-Y-align-key patterns YP1, YP2 and YP3 may overlap the data line DL in a plan view.

FIGS. 24 to 27 are cross-sectional views that illustrate a method of manufacturing a display substrate of FIG. 23.

Figure 24:
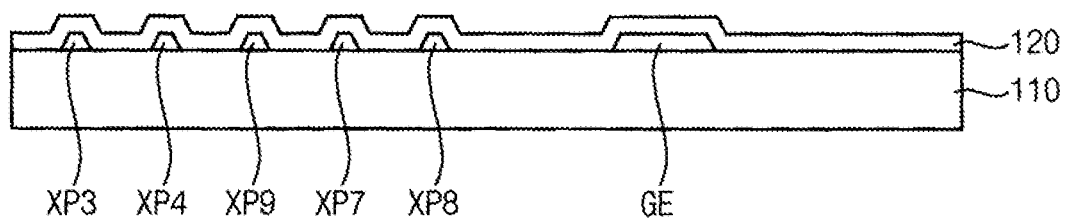
FIGS. 24 to 27 are cross-sectional views that illustrate a method of manufacturing a display substrate of FIG. 23.

Referring to FIG. 24, the gate electrode GE, the third sub-X-align-key pattern XP3, the fourth sub-X-align-key pattern XP4, the seventh sub-X-align-key pattern XP7, the eighth sub-X-align-key pattern XP8 and the ninth sub-X-align-key pattern XP9 are formed on the base substrate 110. Thereafter, the first insulation layer 120 is formed on the base substrate 110 on which the gate electrode GE, the third sub-X-align-key pattern XP3, the fourth sub-X-align-key pattern XP4, the seventh sub-X-align-key pattern XP7, the eighth sub-X-align-key pattern XP8 and the ninth sub-X-align-key pattern XP9 are formed.

The gate electrode GE, the third sub-X-align-key pattern XP3, the fourth sub-X-align-key pattern XP4, the seventh sub-X-align-key pattern XP7, the eighth sub-X-align-key pattern XP8 and the ninth sub-X-align-key pattern XP9 may be formed by patterning a first conductive layer. The first conductive layer may be formed through a sputtering process. The first conductive layer may have a single layer structure that may include copper (Cu), silver (Ag), chrome (Cr), molybdenum (Mo), aluminum (Al), titanium (Ti), manganese (Mn), or a mixture thereof. Alternatively, the first conductive layer may have a multi layer structure with a plurality of layers that include different materials. The first conductive layer may be a gate metal layer. The gate electrode GE, the third sub-X-align-key pattern XP3, the fourth sub-X-align-key pattern XP4, the seventh sub-X-align-key pattern XP7, the eighth sub-X-align-key pattern XP8 and the ninth sub-X-align-key pattern XP9 may be a gate metal pattern. The third sub-X-align-key pattern XP3, the fourth sub-X-align-key pattern XP4, the seventh sub-X-align-key pattern XP7, the eighth sub-X-align-key pattern XP8 and the ninth sub-X-align-key pattern XP9 may be disposed on the same layer as the gate electrode GE. The third sub-X-align-key pattern XP3, the fourth sub-X-align-key pattern XP4, the seventh sub-X-align-key pattern XP7, the eighth sub-X-align-key pattern XP8 and the ninth sub-X-align-key pattern XP9 may include the same material as the gate electrode GE. The third sub-X-align-key pattern XP3, the fourth sub-X-align-key pattern XP4, the seventh sub-X-align-key pattern XP7, the eighth sub-X-align-key pattern XP8 and the ninth sub-X-align-key pattern XP9 may be spaced apart from the gate electrode GE.

The first insulation layer 120 is formed on the base substrate 110 on which the gate electrode GE, the third sub-X-align-key pattern XP3, the fourth sub-X-align-key pattern XP4, the seventh sub-X-align-key pattern XP7, the eighth sub-X-align-key pattern XP8 and the ninth sub-X-align-key pattern XP9 are formed. The first insulation layer 120 may include an inorganic material such as silicon oxide (SiOx) and/or silicon nitride (SiNx). For example, the first insulation layer 120 may include silicon oxide (SiOx), and may have a thickness of about 500 Å. Alternatively, the first insulation layer 120 may include a plurality of layers that include different materials.

Figure 25:
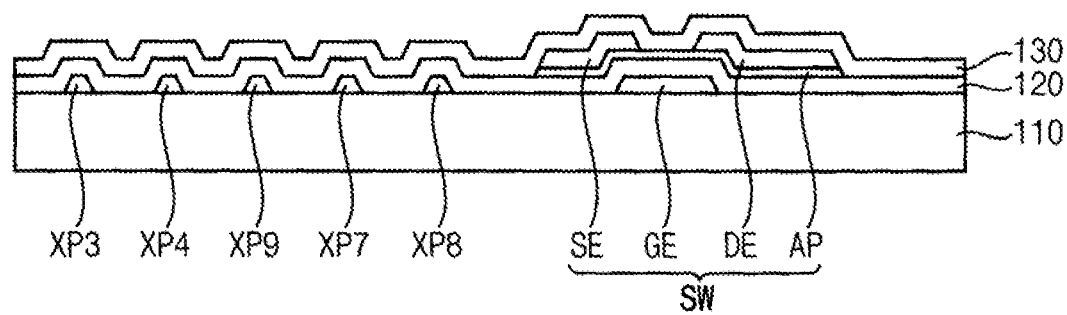

Referring to FIG. 25, a second conductive layer may be formed on the base substrate 110 on which the gate insulation layer 120 is formed. The second conductive layer may include a data metal layer and a semiconductor layer. The data metal layer may include the source electrode SE and the drain electrode DE.

The data metal layer may have a single layer structure that may include copper (Cu), silver (Ag), chrome (Cr), molybdenum (Mo), aluminum (Al), titanium (Ti), manganese (Mn), or a mixture thereof. Alternatively, the data metal layer may have a multi layer structure with a plurality of layers that include different materials. For example, the data metal layer may include a copper layer and a titanium layer disposed on and/or under the copper layer.

The semiconductor layer may include an oxide semiconductor. For example, the oxide semiconductor may include zinc oxide ("ZnO"), zinc tin oxide ("ZTO"), indium zinc oxide ("IZO"), indium oxide ("InO"), titanium oxide ("TiO"), indium gallium zinc oxide ("IGZO"), indium zinc tin oxide ("IZTO"), etc. These may be used alone or in a combination thereof.

The source electrode SE, the drain electrode DE and the data line DL are formed by patterning the second conductive layer. Thereafter, the second insulation layer 130 is formed on the base substrate 110 on which the source electrode SE, the drain electrode DE and the data line DL are formed.

The source electrode SE and the drain electrode DE may have a single layer structure that may include copper (Cu), silver (Ag), chrome (Cr), molybdenum (Mo), aluminum (Al), titanium (Ti), manganese (Mn), or a mixture thereof. Alternatively, the source electrode SE and the drain electrode DE may have a multi layer structure with a plurality of layers that include different materials. For example, the source electrode SE and the drain electrode DE may include a copper layer and a titanium layer disposed on and/or under the copper layer.

Figure 26:
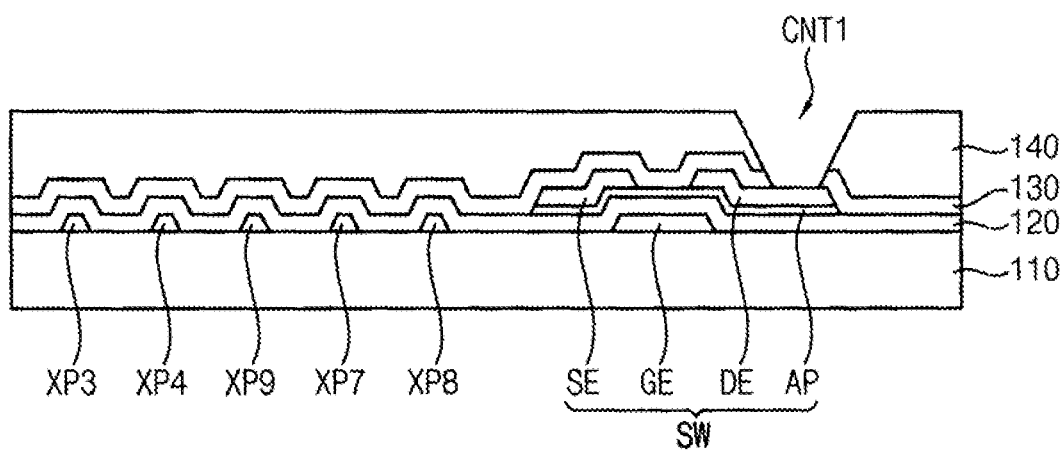

Referring to FIG. 26, the organic layer 140 is disposed on the second insulation layer 130. The organic layer 140 planarizes an upper surface of the substrate to prevent signal line disconnections due to the step. The organic layer 140 may be an insulation layer that includes an organic material. The organic layer 140 may a color filter.

Thereafter, the first insulation layer 120, the second insulation layer 130 and the organic layer 140 are patterned. Therefore, the drain electrode DE is partially exposed.

A first contact hole CNT1 is formed through the organic layer 140 and the second insulation layer 130, so that the first contact hole CNT1 partially exposes the drain electrode DE.

Figure 27:
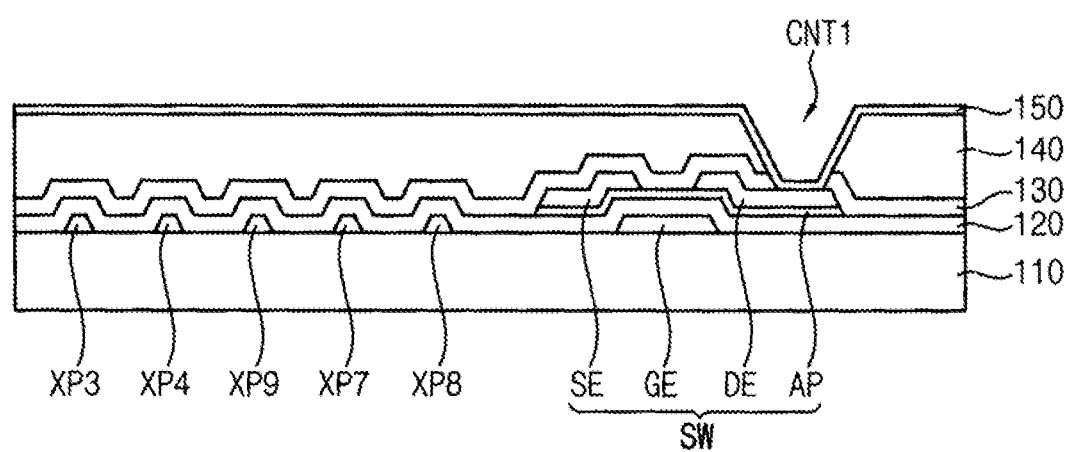

Referring to FIG. 27, a transparent conductive layer 150 is formed on the patterned organic layer 140.

The transparent conductive layer 150 may include a transparent conductive material, such as indium tin oxide (ITO) and indium zinc oxide (IZO). In addition, the transparent conductive layer 150 may include titanium (Ti) and/or molybdenum titanium (MoTi).

Referring to FIG. 23, the transparent conductive layer 150 is patterned to form the pixel electrode PE.

The pixel electrode PE may include a transparent conductive material, such as indium tin oxide (ITO) and indium zinc oxide (IZO). In addition, the pixel electrode PE may include titanium (Ti) and/or molybdenum titanium (MoTi). The pixel electrode PE may be electrically connected with the drain electrode DE. The pixel electrode PE may be electrically connected with the drain electrode DE through the first contact hole CNT1.

According to a present exemplary embodiment, a graphic data system file includes data of an X-align-key and a Y-align-key that can correct a misalignment of the X-component and Y-component. Thus, an alignment of the X-component and Y-component may be improved.

In addition, an X-align-key and a Y-align-key may be disposed on a boundary between adjacent scans. Thus, an alignment between adjacent scans may be improved.

The foregoing is illustrative of exemplary embodiments of the present inventive concept and is not to be construed as limiting thereof. Although a few exemplary embodiments of the present inventive concept have been described, those skilled in the art will readily appreciate that many modifications are possible in the exemplary embodiments without materially departing from the novel teachings of the present inventive concept. Therefore, it is to be understood that the foregoing is illustrative of the present inventive concept and is not to be construed as limited to the specific exemplary embodiments disclosed, and that modifications to the disclosed exemplary embodiments, as well as other exemplary embodiments, are intended to be included within the scope of the appended claims. The present inventive concept is defined by the following claims, with equivalents of the claims to be included therein.

What is claimed is:

1. A maskless exposure device comprising:
   an exposure head comprising a digital micro-mirror device, the digital micro-mirror device being configured to reflect a source beam received from an exposure source to a substrate to scan an exposure beam to the substrate; and
   a system control part configured to control the digital micro-mirror device using a graphic data system file, and
   wherein the graphic data system file comprises data of an align-key, and the align-key comprises:
      a X-align-key that extends in a direction parallel with a scan direction of the exposure head, and has a bar shape in a plan view, wherein the bar shape is longer than it is wide; and
      a Y-align-key disposed adjacent to the X-align-key that has a frame shape in a plan view that encloses an open area, wherein the X-align-key is not contained within the Y-align-key,
   wherein the X-align-key comprises:
      a first plurality of sub-X-align-keys disposed in a first exposure area;
      a second plurality of sub-X-align-keys disposed in a second exposure area adjacent to the first exposure area; and
      a boundary sub-X-align-key disposed on the first exposure area, the second exposure area, and a boundary between the first exposure area and the second exposure area that has a shape that is symmetric relative to the boundary between the first exposure area and the second exposure area, wherein the boundary sub-X-align-key continuously extends from the first exposure area across the boundary to the second exposure area,
   wherein the system control part generates a first correction data configured to correct a misalignment of an X-component by:
      measuring widths of each of a plurality of X-align-key patterns formed using the plurality of sub-X-align-keys;
      calculating an average width of the first plurality of X-align-key patterns and an average width of the second plurality of X-align-key patterns;
      calculating a target width of an X-align-key pattern on the boundary between the first exposure area and the second exposure area from one half of a sum of the average width of the first plurality of X-align-key patterns and the average width of the second plurality of X-align-key patterns;
      comparing the target width of the X-align-key pattern with the width of the boundary X-align-key pattern; and
      generating the first correction data that corrects a misalignment of X-component using a difference between the target width X-align-key pattern and the width of the boundary X-align-key pattern.

2. The maskless exposure device of claim 1,
wherein the second plurality of sub-X-align-keys are disposed symmetrically with the first plurality of sub-X-align-keys relative to the boundary between the first exposure area and the second exposure area.

3. The maskless exposure device of claim 2, wherein each of the sub-X-align-keys has a same width.

4. The maskless exposure device of claim 2, wherein each of the first plurality of sub-X-align-keys and the second plurality of sub-X-align-keys includes three sub-X-align-keys.

5. The maskless exposure device of claim 2, wherein each of the first plurality of sub-X-align-keys and the second plurality of sub-X-align-keys includes four sub-X-align-keys.

6. The maskless exposure device of claim 1, wherein the system control part comprises:
a file producing part configured to produce a graphic data system file for each of a plurality of patterns to be formed on the substrate;
a data outputting part configured to generate digital micro-mirror device on/off data from the graphic data system file to control on/off timing of the digital micro-mirror device; and
a transfer control part configured to output a transfer signal that transfers a stage upon which the substrate is fixed.

7. The maskless exposure device of claim 6, wherein the transfer control part controls on/off timing of the exposure beam and transfers the stage in response to the digital micro-mirror device on/off data received from the data outputting part.

8. A maskless exposure device comprising:
an exposure head comprising a digital micro-mirror device, the digital micro-mirror device being configured to reflect a source beam received from an exposure source to a substrate to scan an exposure beam to the substrate; and
a system control part configured to control the digital micro-mirror device using a graphic data system file, and
wherein the graphic data system file comprises data of an align-key, and the align-key comprises:
a X-align-key that extends in a direction parallel with a scan direction of the exposure head, and has a bar shape in a plan view, wherein the bar shape is longer than it is wide; and
a Y-align-key disposed adjacent to the X-align-key that has a frame shape in a plan view that encloses an open area, wherein the X-align-key is not contained within the Y-align-key,
wherein the Y-align-key comprises:
a first sub-Y-align-key disposed in a first exposure area;
a second sub-Y-align-key disposed in a second exposure area adjacent to the first exposure area; and
a third sub-Y-align-key disposed on the first exposure area, the second exposure area, and a boundary between the first exposure area and the second exposure area that has a shape that is symmetric relative to the boundary between the first exposure area and the second exposure area, wherein the third sub-Y-align-key continuously extends from the first exposure area across the boundary to the second exposure area,
wherein the system control part generates a second correction data configured to correct a misalignment of a Y-component by:
measuring total-pitches of a plurality of Y-align-key patterns formed using the plurality of sub-Y-align-keys;
measuring misalignment-values of each of the plurality of Y-align-key patterns; and
generating the second correction data that corrects the misalignment of the Y-component using the misalignment values of each of the plurality of Y-align-key patterns.

9. The maskless exposure device of claim 8, wherein the second sub-Y-align-key is disposed symmetrically with the first sub-Y-align-key relative to a boundary between the first exposure area and the second exposure area.

10. A method of maskless exposure, the method comprising:
producing a graphic data system file with respect to a pattern formed on a substrate;
generating digital micro-mirror device on/off data from the graphic data system file;
exposing the substrate in response to the digital micro-mirror device on/off data;
and
generating a first correction data configured to correct a misalignment of an X-component,
wherein the graphic data system file comprises data of an align-key, wherein the align-key comprises:
an X-align-key that extends in a direction parallel to a scan direction of the exposure head that has a bar shape in a plan view,
wherein the X-align-key comprises a plurality of sub-X-align-keys organized into
a first plurality of sub-X-align-keys disposed in a first exposure area;
a second plurality of sub-X-align-keys disposed in a second exposure area adjacent to the first exposure area; and
a boundary sub-X-align-key disposed on a boundary between the first exposure area and the second exposure area that has a shape that is symmetric relative to the boundary between the first exposure area and the second exposure area,
wherein generating the first correction data comprises:
measuring widths of each of a plurality of X-align-key patterns formed using the plurality of sub-X-align-keys;
calculating an average width of the first plurality of X-align-key patterns and an average width of the second plurality of X-align-key patterns;
calculating a target width of an X-align-key pattern on the boundary between the first exposure area and the second exposure area from one half of a sum of the average width of the first plurality of X-align-key patterns and the average width of the second plurality of X-align-key patterns;
comparing the target width of the X-align-key pattern with the width of the boundary X-align-key pattern; and
generating the first correction data that corrects a misalignment of X-component using a difference between the target width X-align-key pattern and the width of the boundary X-align-key pattern.

11. The method of claim 10, wherein the second plurality of sub-X-align-keys are disposed symmetrically to the first plurality of sub-X-align-keys relative to the boundary between the first exposure area and the second exposure area, and wherein each of the plurality of sub-X-align-keys has a same width.

12. The method of claim 11, wherein each of the first plurality of sub-X-align-keys and second plurality of sub-X-align-keys has three sub-X-align-keys.

13. The method of claim 11, wherein each of the first plurality of sub-X-align-keys and second plurality of sub-X-align-keys has four sub-X-align-keys.

14. The method of claim 10, further comprising
generating a second correction data configured to correct a misalignment of a Y-component, wherein the align-key comprises a Y-align-key disposed adjacent to the X-align-key that has a frame shape in a plan view.

15. The method of claim 14, wherein when there is a misalignment of one or both of the X-component and the Y-component, the method further comprises exposing the substrate according to one or both of the first and the second correction data.

16. A method of maskless exposure, the method comprising:
producing a graphic data system file with respect to a pattern formed on a substrate;
generating digital micro-mirror device on/off data from the graphic data system file;
exposing the substrate in response to the digital micro-mirror device on/off data; and
generating a second correction data configured to correct a misalignment of a Y-component,
wherein the graphic data system file comprises data of an align-key, wherein the align-key comprises:
an X-align-key that extends in a direction parallel to a scan direction of the exposure head that has a bar shape in a plan view; and
a Y-align-key disposed adjacent to the X-align-key that has a frame shape in a plan view,
wherein the Y-align-key comprises a plurality of sub-Y-align-keys,
wherein generating the second correction data comprises:
measuring total-pitches of a plurality of Y-align-key patterns formed using the plurality of sub-Y-align-keys;
measuring misalignment values of each of the plurality of Y-align-key patterns;
and
generating the second correction data that corrects a misalignment of Y-component using misalignment values of each of the plurality of Y-align-key patterns.

17. The method of claim 16, further comprising generating a first correction data configured to correct a misalignment of an X-component,
wherein the plurality of sub-Y-align-keys comprises
a first sub-Y-align-key disposed in a first exposure area;
a second sub-Y-align-key disposed in a second exposure area adjacent to the first exposure area; and
a third sub-Y-align-key disposed on a boundary between the first exposure area and the second exposure area that has a shape that is symmetric relative to the boundary of the first exposure area and the second exposure area.

18. The method of claim 17, wherein the second sub-Y-align-key is disposed symmetrically with the first sub-Y-align-key relative to a boundary between the first exposure area and the second exposure area.

* * * * *